US012435441B2

(12) United States Patent
Yoshida

(10) Patent No.: US 12,435,441 B2
(45) Date of Patent: Oct. 7, 2025

(54) METHOD FOR MANUFACTURING NITRIDE SEMICONDUCTOR SUBSTRATE, NITRIDE SEMICONDUCTOR SUBSTRATE, AND LAMINATE STRUCTURE

(71) Applicant: SUMITOMO CHEMICAL COMPANY, LIMITED, Tokyo (JP)

(72) Inventor: Takehiro Yoshida, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 886 days.

(21) Appl. No.: 17/287,827

(22) PCT Filed: Oct. 10, 2019

(86) PCT No.: PCT/JP2019/040117
§ 371 (c)(1),
(2) Date: Aug. 9, 2021

(87) PCT Pub. No.: WO2020/085111
PCT Pub. Date: Apr. 30, 2020

(65) Prior Publication Data
US 2021/0355601 A1    Nov. 18, 2021

(30) Foreign Application Priority Data

Oct. 26, 2018 (JP) .................. 2018-201558
Feb. 19, 2019 (JP) .................. 2019-027633

(51) Int. Cl.
C30B 25/04        (2006.01)
C30B 25/20        (2006.01)
(Continued)

(52) U.S. Cl.
CPC .............. *C30B 25/04* (2013.01); *C30B 25/20* (2013.01); *C30B 29/406* (2013.01); *H10D 62/405* (2025.01); *H10D 62/8503* (2025.01)

(58) Field of Classification Search
CPC ....... C30B 25/04; C30B 25/20; C30B 29/406; C30B 25/186; H01L 29/045;
(Continued)

(56) References Cited

U.S. PATENT DOCUMENTS 6,468,347 B1    10/2002  Motoki et al.
7,035,373 B2 *   4/2006  Omote .................... G21K 1/06
                                                378/81
(Continued)

FOREIGN PATENT DOCUMENTS

JP    2001-102307 A    4/2001
JP    2004-193371 A    7/2004
(Continued)

OTHER PUBLICATIONS

Inaba, "Special Feature: GaN for Opto- and Power-electronic Applications (1) General features of GaN-related materials," Rigaku Journal 30 (2014) pp. 1-6.*
(Continued)

*Primary Examiner* — Jay C Kim
(74) *Attorney, Agent, or Firm* — Foley & Lardner LLP

(57) ABSTRACT

A step of preparing a base substrate of a single crystal of a group III nitride semiconductor; a growth inhibition layer forming step of performing in situ formation of a growth inhibition layer over the entire main surface of the base substrate in a vapor phase growth apparatus; a first step of growing a first layer by epitaxially growing a single crystal of a group III nitride semiconductor on the main surface of the base substrate via openings in the growth inhibition layer by using the vapor phase growth apparatus where the base substrate on which the growth inhibition layer has been formed is placed in the vapor phase growth apparatus; and a second step of growing a second layer with a mirror surface by epitaxially growing a single crystal of a group III nitride semiconductor on the first layer so as to make the inclined interfaces disappear.

5 Claims, 14 Drawing Sheets

(51) Int. Cl.
  *C30B 29/40* (2006.01)
  *H10D 62/40* (2025.01)
  *H10D 62/85* (2025.01)

(58) Field of Classification Search
  CPC ........... H01L 29/2003; H01L 21/02389; H01L 21/0243; H01L 21/02433; H01L 21/02488; H01L 21/02513; H01L 21/0262; H01L 21/02458; H01L 21/0254; H01L 21/02576; H01L 21/02639; H01L 21/02647; H01L 21/02658; H10D 62/405; H10D 62/8503; C23C 14/14; C23C 16/01; C23C 16/02; C23C 16/34
  See application file for complete search history.

(56) References Cited

U.S. PATENT DOCUMENTS

| | | | | |
|---|---|---|---|---|
| 8,188,458 | B2 * | 5/2012 | Craven | ............. H01L 21/02458 257/14 |
| 10,822,718 | B2 * | 11/2020 | Nagashima | ............. C30B 25/20 |
| 11,802,049 | B2 * | 10/2023 | Mesuda | ................. C04B 35/58 |
| 2005/0076828 | A1 | 4/2005 | Taki et al. | |
| 2013/0072005 | A1 | 3/2013 | Fujikura | |

FOREIGN PATENT DOCUMENTS

| | | |
|---|---|---|
| JP | 2005-072310 A | 3/2005 |
| JP | 2013-060349 A | 4/2013 |
| JP | 2013-107819 A | 6/2013 |
| JP | 2013-214686 A | 10/2013 |
| JP | 2014-078653 A | 5/2014 |

OTHER PUBLICATIONS

International Preliminary Report on Patentability and Written Opinion issued in connection with International Patent Application No. PCT/JP2019/040117, dated Apr. 27, 2021.

International Searching Authority, "International Search Report," issued in connection with International Patent Application No. PCT/JP2019/040117, dated Nov. 19, 2019.

International Searching Authority, "Written Opinion," issued in connection with International Patent Application No. PCT/JP2019/040117, dated Nov. 19, 2019.

* cited by examiner

S100  Base substrate preparation step
S190  Growth inhibition layer forming step
S220  Inclined interface expansion step
S200  First step
S240  Inclined interface maintenance step
S320  c-plane expansion step
S300  Second step
S340  Main growth step
S400  Slicing step
S500  Polishing step Sample 1

A = Second c-plane growth region
B = Inclined interface growth region
C = First c-plane growth region
D = Base substrate
E = Second layer
F = First layer Sample 2

A = Second c-plane growth region
B = Inclined interface growth region
C = First c-plane growth region
D = Base substrate
E = Second layer
F = First layer Sample 1

METHOD FOR MANUFACTURING NITRIDE SEMICONDUCTOR SUBSTRATE, NITRIDE SEMICONDUCTOR SUBSTRATE, AND LAMINATE STRUCTURE

CROSS-REFERENCE TO RELATED APPLICATIONS

The present application claims priority under 35 U.S.C. § 371 to International Patent Application No. PCT/JP2019/040117, filed Oct. 10, 2019, which claims priority to and the benefit of Japanese Patent Application Nos. 2018-201558, filed on Oct. 26, 2018, and 2019-027633, filed on Feb. 19, 2019. The contents of these applications are hereby incorporated by reference in their entireties.

TECHNICAL FIELD

The present disclosure relates to a method for manufacturing a nitride semiconductor substrate, a nitride semiconductor substrate, and a laminated structure.

BACKGROUND ART

In a conventionally known technique, a substrate that is constituted by a single crystal of a group III nitride semiconductor is used as a base substrate (seed substrate), and a crystal layer that is constituted by a single crystal of a group III nitride semiconductor is further grown on a main surface of the base substrate for which the closest low index crystal plane is a (0001) plane. According to this technique, at least one nitride semiconductor substrate can be obtained by slicing the crystal layer grown to a predetermined thickness (for example, Patent Document 1).

CITATION LIST

Patent Documents

Patent Document 1: Japanese Patent Application Laid-Open Publication No. 2013-60349

SUMMARY OF INVENTION

Technical Problem

An object of the present disclosure is to improve crystal quality of a nitride semiconductor substrate.

Solution to Problem

According to an aspect of the present disclosure,
provided is a method for manufacturing a nitride semiconductor substrate including:
a step of preparing a base substrate that is constituted by a single crystal of a group III nitride semiconductor, has a mirror main surface, and in which a low index crystal plane closest to the main surface is a (0001) plane;
a growth inhibition layer forming step of performing in situ formation of a growth inhibition layer in a vapor phase growth apparatus, the growth inhibition layer including growth inhibition portions that are randomly scattered over the entire main surface of the base substrate;
a first step of growing a first layer by epitaxially growing a single crystal of a group III nitride semiconductor on the main surface of the base substrate via openings in the growth inhibition layer by using the vapor phase growth apparatus in a state where the base substrate on which the growth inhibition layer has been formed is placed in the vapor phase growth apparatus, the single crystal of the group III nitride semiconductor having a top surface at which a (0001) plane is exposed, a plurality of recessed portions formed by inclined interfaces other than the (0001) plane being generated in the top surface due to the growth inhibition layer, the inclined interfaces being gradually expanded toward an upper side of the main surface of the base substrate to make the (0001) plane disappear from the top surface, and a surface of the first layer being constituted only by the inclined interfaces; and
a second step of growing a second layer that includes a mirror surface by epitaxially growing a single crystal of a group III nitride semiconductor on the first layer so as to make the inclined interfaces disappear.
According to another aspect of the present disclosure,
provided is a nitride semiconductor substrate, having a diameter of 2 inches or more and including a main surface for which the closest low index crystal plane is a (0001) plane,
wherein, when an X-ray rocking curve of (0002) plane diffraction is measured by irradiating the main surface with Cu K$\alpha$1 X-rays via a two-crystal monochromator of a Ge (220) plane and a slit,
FWHMb is 38.5 arcsec or less,
difference FWHMa−FWHMb obtained by subtracting FWHMb from FWHMa is 30% or less of FWHMa, and FWHMa≥FWHMb,
wherein FWHMa is full width at half maximum of the (0002) plane diffraction when a slit width in $\omega$ direction is 1 mm, and
FWHMb is full width at half maximum of the (0002) plane diffraction when a slit width in $\omega$ direction is 0.1 mm.
According to yet another aspect of the present disclosure,
provided is a laminated structure including:
a base substrate that is constituted by a single crystal of a group III nitride semiconductor, has a mirror main surface, and in which a low index crystal plane closest to the main surface is a (0001) plane;
a growth inhibition layer that includes growth inhibition portions randomly scattered over the main surface of the base substrate;
a first low oxygen concentration region that is provided on the main surface of the base substrate and the growth inhibition portions and is constituted by a single crystal of a group III nitride semiconductor;
a high oxygen concentration region that is provided on the first low oxygen concentration region and is constituted by a single crystal of a group III nitride semiconductor; and
a second low oxygen concentration region that is provided on the high oxygen concentration region and is constituted by a single crystal of a group III nitride semiconductor,
wherein an oxygen concentration in the high oxygen concentration region is higher than an oxygen concentration in the first low oxygen concentration region and an oxygen concentration in the second low oxygen concentration region, and
when an arbitrary cross section that is perpendicular to the main surface is observed, an upper surface of the first low oxygen concentration region includes a plurality of valleys and a plurality of mountains, and an average distance between a pair of mountains spaced apart from each other in a direction along the main surface is greater than 50 μm, the pair of mountains being closest to each other among the plurality of mountains with one of the plurality of valleys sandwiched therebetween.

Advantageous Effects of Invention

According to the present disclosure, crystal quality of a nitride semiconductor substrate can be improved.

BRIEF DESCRIPTION OF DRAWINGS

FIG. 9(c) is a schematic cross-sectional view taken along a-axis of the nitride semiconductor substrate according to the first embodiment of the present disclosure.

DESCRIPTION OF EMBODIMENTS

<Finding Obtained by Inventor>

Figure 1:
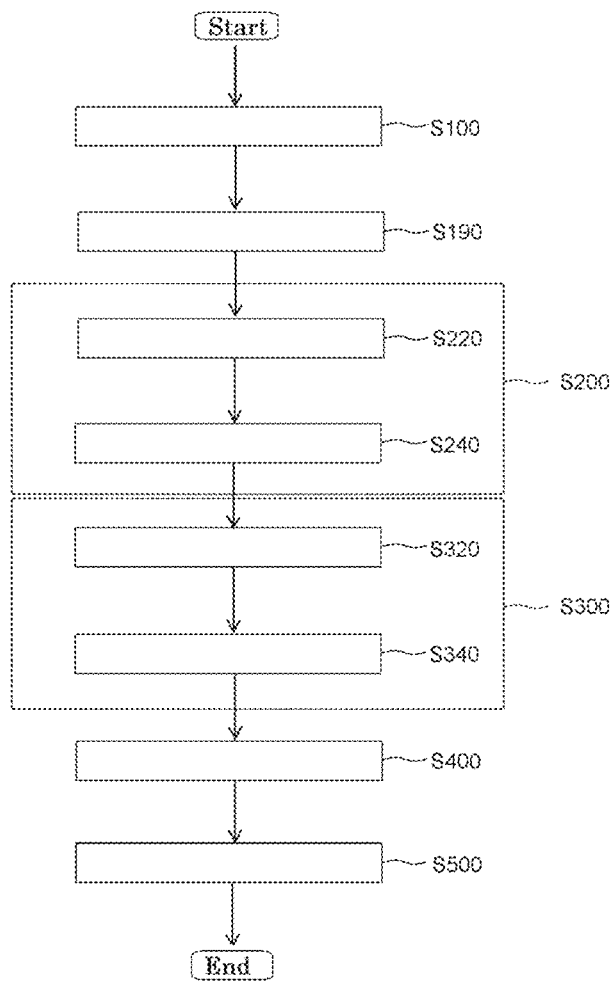
FIG. 1 is a flowchart illustrating a method for manufacturing a nitride semiconductor substrate according to a first embodiment of the present disclosure.

First, findings obtained by the inventor will be described.

(i) Dislocation Density

Conventionally, when a crystal layer is further epitaxially grown on a base substrate constituted by a single crystal of a group III nitride semiconductor as described above, for example, the crystal layer on the base substrate is grown with only a c-plane as a growth surface without exposing inclined interfaces other than the c-plane. In this case, the dislocation density in a surface of the crystal layer tended to be inversely proportional to the thickness of the crystal layer.

However, when the crystal layer is grown with only the c-plane as the growth surface, the dislocation density in the surface of the crystal layer cannot be sufficiently lowered unless the crystal layer is grown very thick. This causes a reduction in productivity for obtaining a nitride semiconductor substrate having a desired dislocation density in the main surface.

Accordingly, a technique that makes it possible to efficiently obtain a nitride semiconductor substrate having a low dislocation density has been desired.

(ii) Variation in Off-Angle

In a nitride semiconductor substrate, a (0001) plane may be curved in a concave spherical shape with respect to the main surface. When the (0001) plane is curved with respect to the main surface, an off-angle varies within the main surface, the off-angle being an angle formed by <0001> axis with respect to a normal of the main surface.

The off-angle in the nitride semiconductor substrate affects, for example, a surface morphology of a semiconductor functional layer grown on the substrate. For example, when a radius of curvature of the (0001) plane of the substrate is small and a variation in the off-angle of the substrate is large, the surface morphology of the semiconductor functional layer may deteriorate in a portion on the substrate, due to the off-angle. Therefore, when a semiconductor device is manufactured as a Schottky barrier diode (SBD) using this substrate, a withstand voltage and reliability may decrease in the semiconductor device that is cut out from the portion where the surface morphology of the semiconductor functional layer has deteriorated.

Further, for example, when indium (In) is doped on the substrate to form a light emitting layer, the off-angle in the nitride semiconductor substrate affects the In content in the light emitting layer. For example, when the radius of curvature of the (0001) plane of the substrate is small and the variation in the off-angle of the substrate is large, the In content in the light emitting layer varies depending on the variation in the off-angle of the substrate. Therefore, there is a possibility that a light emission wavelength will vary or light emission will be uneven in a light emitting element that includes the light emitting layer.

Accordingly, a technique capable of reducing the variation in the off-angle in the nitride semiconductor substrate has been desired, to prevent practical problems such as deterioration of the surface morphology and uneven light emission.

The present disclosure is based on the findings of the above (i) and (ii) found by the inventor of the present disclosure.

First Embodiment of the Present Disclosure

Hereinafter, a first embodiment of the present disclosure will be described with reference to the drawings.
(1) Method for Manufacturing a Nitride Semiconductor Substrate A method for manufacturing a nitride semiconductor substrate according to the present embodiment will be described with reference to FIGS. 1 to 6. FIG. 1 is a flowchart illustrating the method for manufacturing a nitride semiconductor substrate according to the present embodiment. FIGS. 2(a) to 2(g), FIGS. 3(a) to 3(d), and FIGS. 5(a) to 6(b) are schematic sectional views illustrating a part of the method for manufacturing a nitride semiconductor substrate according to the present embodiment. FIG. 4 is a schematic perspective view illustrating a part of the method for manufacturing a nitride semiconductor substrate according to the present embodiment. FIG. 4 corresponds to a perspective view at a time point of FIG. 3(c), and illustrates a part of a first layer 30 growing on a base substrate 10. Further, in thin solid line indicates a crystal plane in a process of growth in FIG. 5(b), and dotted lines indicate dislocations in FIGS. 3(d) and 5(a) to 6(b).

As illustrated in FIG. 1, the method for manufacturing a nitride semiconductor substrate according to the present embodiment includes: for example, a base substrate preparation step S100, a growth inhibition layer forming step S190, a first step S200, a second step S300, a slicing step S400, and a polishing step S500.
S100: Base Substrate Preparation Step First, in the base substrate preparation step S100, a base substrate 10 that is constituted by a single crystal of a group III nitride semiconductor is prepared. In the present embodiment, for example, a gallium nitride (GaN) free-standing substrate is prepared as the base substrate 10.

Hereinafter, in a crystal of a group III nitride semiconductor having a wurtzite structure, <0001> axis (for example, axis) is referred to as a "c-axis", and (0001) plane is referred to as a "c-plane". The (0001) plane may be referred to as a "+c plane (group III element polar plane)", and the (000-1) plane may be referred to as a "-c plane (nitrogen (N) polar plane)". Further, <1-100> axis (for example, [1-100] axis) is referred to as an "m-axis", and {1-100} plane is referred to as an "m-plane". The m-axis may be expressed as <10-10> axis. Further, <11-20> axis (for example, [11-20] axis) is referred to as an "a-axis", and {11-20} plane is referred to as an "a-plane".

In the base substrate preparation step S100 of the present embodiment, for example, the base substrate 10 is prepared according to a VAS (Void-Assisted Separation) method.

Figure 2A:
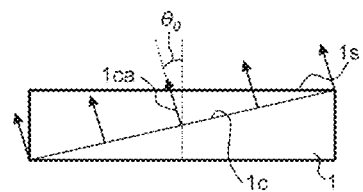
FIGS. 2(a) to 2(g) are schematic cross-sectional views illustrating a part of the method for manufacturing a nitride semiconductor substrate according to the first embodiment of the present disclosure.
Figure 3A:
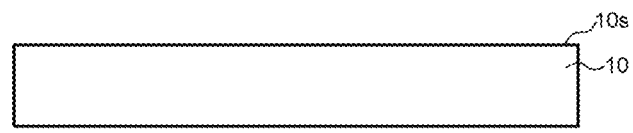
FIGS. 3(a) to 3(d) are schematic cross-sectional views illustrating a part of the method for manufacturing a nitride semiconductor substrate according to the first embodiment of the present disclosure.
Figure 3B:
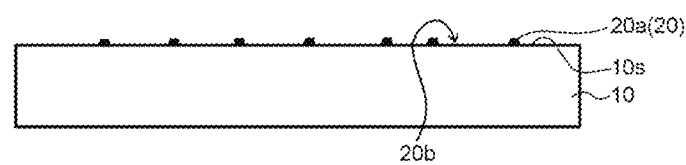

Specifically, the base substrate preparation step S100 includes, for example, a crystal growth substrate preparation step S110, a first crystal layer forming step S120, a metal layer forming step S130, a void forming step S140, a second crystal layer forming step S150, a peeling step S160, a slicing step S170, and a polishing step S180.
S110: Crystal Growth Substrate Preparation Step First, as illustrated in FIG. 2(a), a crystal growth substrate 1 (hereinafter may be abbreviated as a "substrate 1") is prepared. The substrate 1 is, for example, a sapphire substrate. Also, the substrate 1 may be, for example, a Si substrate or a gallium arsenide (GaAs) substrate. The substrate 1 has, for example, a main surface $1s$ which is a growth surface. A low index crystal plane that is closest to the main surface $1s$ is, for example, a c-plane $1c$.

Figure 2B:
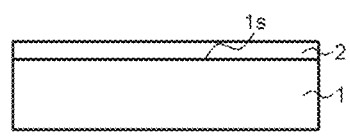
Figure 2C:
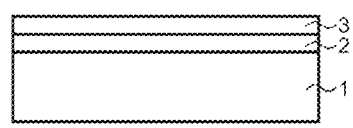

In the present embodiment, the c-plane $1c$ of the substrate 1 is inclined with respect to the main surface $1s$. A c-axis $1ca$ of the substrate 1 is inclined at a predetermined off-angle $\theta_0$ with respect to a normal of the main surface $1s$. The off-angle $\theta_0$ in the main surface $1s$ of the substrate 1 is uniform over the entire main surface $1s$. The off-angle $\theta_0$ in the main surface $1s$ of the substrate 1 affects an off-angle $\theta_3$ at the center of a main surface $10s$ of the base substrate 10, which will be described later.
S120: First Crystal Layer Forming Step Next, as illustrated in FIG. 2(b), for example, a low-temperature growth GaN buffer layer and a Si-doped GaN layer are grown in this order as a first crystal layer (underground growth layer) 2 on the main surface $1s$ of the substrate 1, by supplying trimethylgallium (TMG) gas as a group III source gas, ammonia gas ($NH_3$) as a nitrogen source gas, and monosilane ($SiH_4$) gas as an n-type dopant gas, to the substrate 1 that is heated to a predetermined growth temperature, by a metalorganic vapor phase growth (MOVPE) method. At this time, the thickness of the low-temperature growth GaN buffer layer and the thickness of the Si-doped GaN layer are, for example, 20 nm and 0.5 μm, respectively.
S130: Metal Layer Forming Step Next, as illustrated in FIG. 2(c), a metal layer 3 is deposited on the first crystal layer 2. The metal layer 3 is, for example, a titanium (Ti) layer. Further, the thickness of the metal layer 3 is, for example, 20 nm.
S140: Void Forming Step Next, the above-described substrate 1 is put into an electric furnace, and the substrate 1 is placed on a susceptor having a predetermined heater. After the substrate 1 is placed on the susceptor, the substrate 1 is heated by the heater and heat treatment is performed thereto in an atmosphere containing hydrogen gas or hydride gas. Specifically, for example, the heat treatment is performed at a predetermined temperature for 20 minutes in a hydrogen ($H_2$) gas stream containing 20% $NH_3$ gas.

The heat treatment temperature is, for example, 850° C. or higher and 1,100° C. or lower. By performing such a heat treatment, the metal layer 3 is nitrided to form a metal nitride layer 5 having high-density fine holes on the surface. Further, by performing the above-described heat treatment, a part of the first crystal layer 2 is etched through the holes of the metal nitride layer 5 to form high-density voids in the first crystal layer 2.

Figure 2D:
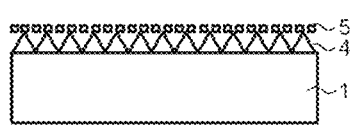
Figure 2E:
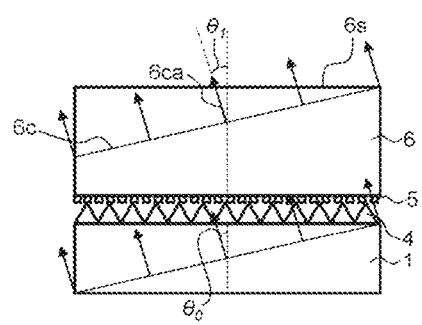

Thereby, as illustrated in FIG. 2(d), a void-containing first crystal layer 4 is formed.
S150: Second Crystal Layer Forming Step Next, for example, a Si-doped GaN layer is epitaxially grown as a second crystal layer (main growth layer) 6 over the void-containing first crystal layer 4 and the metal nitride layer 5 by supplying gallium chloride (GaCl) gas, $NH_3$ gas, and dichlorosilane ($SiH_2Cl_2$) gas as an n-type dopant gas, to the substrate 1 that is heated to a predetermined growth temperature by a hydride vapor deposition (HVPE) method. A Ge-doped GaN layer may be epitaxially grown as the second crystal layer 6 by supplying tetrachlorogermane ($GeCl_4$) gas or the like instead of $SiH_2Cl_2$ gas, as an n-type dopant gas.

At this time, the second crystal layer 6 grows from the void-containing first crystal layer 4 over the void-containing first crystal layer 4 and the metal nitride layer 5 through the holes in the metal nitride layer 5. Some of the voids in the void-containing first crystal layer 4 are filled with the second crystal layer 6, but the other voids in the void-containing first crystal layer 4 remain. A flat gap is formed between the second crystal layer 6 and the metal nitride layer 5 due to the voids remaining in the void-containing first crystal layer 4. This gap causes peeling of the second crystal layer 6 in a peeling step S160 described later.

Further, at this time, the second crystal layer 6 is grown by inheriting an orientation of the substrate 1. That is, an off-angle $\theta_1$ in the main surface of the second crystal layer 6 is uniform over the entire main surface, similarly to the off-angle $\theta_0$ in the main surface 1s of the substrate 1.

Further, at this time, the thickness of the second crystal layer 6 is, for example, 600 µm or more, preferably 1 mm or more. An upper limit of the thickness of the second crystal layer 6 is not particularly limited, but is preferably 50 mm or less from the standpoint of improving productivity.

S160: Peeling Step

After the growth of the second crystal layer 6 is complete, the second crystal layer 6 naturally peels off from the substrate 1 by separating from the void-containing first crystal layer 4 and the metal nitride layer 5 in a process of cooling a HVPE apparatus used to grow the second crystal layer 6.

At this time, tensile stress is introduced into the second crystal layer 6 as a result of initial nuclei, which are generated in the growth process, attracting each other. Therefore, due to the tensile stress generated in the second crystal layer 6, an internal stress acts on the second crystal layer 6 such that a front surface side thereof becomes concave. Further, a dislocation density in the main surface (front surface) side of the second crystal layer 6 is low, while a dislocation density in a back surface side of the second crystal layer 6 is high. Therefore, due to the difference in the dislocation density in a thickness direction of the second crystal layer 6 as well, an internal stress acts on the second crystal layer 6 such that the front surface side thereof becomes concave.

Figure 2F:
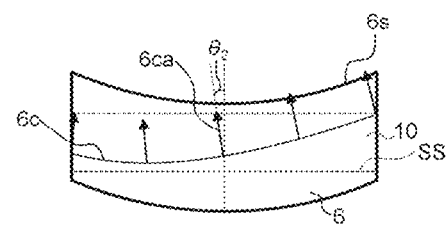

As a result, as illustrated in FIG. 2(f), after the second crystal layer 6 is peeled off from the substrate 1, the front surface side thereof is warped so as to be concave. Therefore, a c-plane 6c of the second crystal layer 6 is curved in a concave spherical shape with respect to a plane perpendicular to a normal direction of the center of the main surface 6s of the second crystal layer 6. An off-angle $\theta_2$ formed by a c-axis 6ca with respect to the normal of the center of the main surface 6s of the second crystal layer 6 has a predetermined distribution.

S170: Slicing Step

Next, as illustrated in FIG. 2(f), for example, the second crystal layer 6 is sliced using a wire saw along a cut surface SS substantially perpendicular to the normal direction of the center of the main surface 6s of the second crystal layer 6.

Figure 2G:
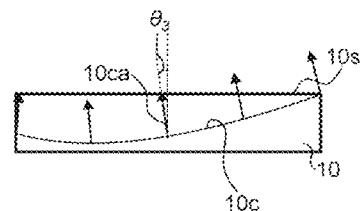

Thereby, as illustrated in FIG. 2(g), the base substrate 10 as an as-sliced substrate is formed. At this time, the thickness of the base substrate 10 is, for example, 450 µm. The off-angle $\theta_3$ of the base substrate 10 may change from the off-angle $\theta_2$ of the second crystal layer 6 due to dependence on the slice direction.

S180: Polishing Step

Next, both sides of the base substrate 10 are polished by a polishing device. Thereby, the main surface 10s of the base substrate 10 is mirror-finished.

By the above-described base substrate preparation step S100, the base substrate 10 constituted by a single crystal of GaN is obtained.

The base substrate 10 has a diameter of, for example, 2 inches or more. The base substrate 10 has a thickness of, for example, 300 µm or more and 1 mm or less.

The main surface 10s of the base substrate 10 has, for example, a main surface (base surface) 10s which is an epitaxial growth surface. In the present embodiment, a low index crystal plane that is closest to the main surface 10s is, for example, a c-plane (+c plane) 10c.

The c-plane 10c of the base substrate 10 is curved in a concave spherical shape with respect to the main surface 10s. The term "spherical" as used herein means a curved surface that approximates to a spherical surface. Further, "approximates to a spherical surface" as used herein means approximating to a surface of a perfect circular sphere or an elliptical sphere within a predetermined range of error.

In the present embodiment, the c-plane 10f of the base substrate 10 has, for example, a curved surface that approximates to a spherical surface in each of a cross section taken along the m-axis and a cross section taken along the a-axis. A radius of curvature of the c-plane 10c in the base substrate 10 is, for example, 1 m or more and less than 10 m.

Since the c-plane 10c of the base substrate 10 is curved, the off-angle $\theta_3$ formed by a c-axis 10ca with respect to the normal of the center of the main surface 10s of the base substrate 10 has a predetermined distribution.

In the present embodiment, a size of the off-angle $\theta_3$ at the center of the main surface 10s of the base substrate 10 is, for example, greater than 0° and 1° or less.

The size and a direction of the off-angle $\theta_3$ at the center of the main surface 10s of the base substrate 10 can be adjusted, for example, by adjusting a size and a direction of the off-angle $\theta_0$ of the crystal growth substrate 1 used in the above-described VAS method, and a slice angle and the slice direction in the slicing step S170.

Further, in the present embodiment, a root mean square roughness RMS of the main surface 10s of the base substrate 10 is, for example, less than 1 nm.

Further, in the present embodiment, since the base substrate 10 is manufactured by the above-described VAS method, the dislocation density in the main surface 10s of the base substrate 10 is low. Specifically, the dislocation density in the main surface 10s of the base substrate 10 is, for example, $3 \times 10^6$ cm$^{-2}$ or more and less than $1 \times 10^7$ cm$^{-2}$.

S190: Growth Inhibition Layer Forming Step (Anti-Surfactant Step, Growth Inhibition Step)

After the base substrate 10 is prepared, the base substrate 10 is placed into a predetermined vapor phase growth apparatus (e.g., HVPE apparatus) for growing a first layer 30 and a second layer 40, which will be described later. After the base substrate 10 is placed into the apparatus, as illustrated in FIG. 3(b), in situ formation of a growth inhibition layer 20 that includes growth inhibition portions 20a and openings 20b is performed on the main surface 10s of the base substrate 10 in the vapor phase growth apparatus before the first step S200, which will be described later. In the growth inhibition layer 20, the growth inhibition portions 20a are randomly scattered over the entire main surface 10s of the base substrate 10. On the other hand, the openings 20b are formed between the growth inhibition portions 20a to expose the main surface 10s of the base substrate 10 in the openings 20b. As a result, three-dimensional growth of the first layer 30 is promoted due to the growth inhibition layer 20 (using the growth inhibition layer 20 as a trigger) in the first step S200 described later, and a plurality of recessed portions 30p that are formed by inclined interfaces 30i other than the c-plane can be generated in a top surface 30u of the first layer 30.

The "growth inhibition layer 20" as used herein means a layer that inhibits (suppresses) crystal growth of the group III nitride semiconductor, and that can be present (remain) stably under conditions under which crystal growth of the group III nitride semiconductor occurs. The "conditions under which crystal growth of the group III nitride semiconductor occurs" means, for example, an atmosphere at a growth temperature of 1000° C. or higher and contains $H_2$ gas, hydrogen chloride (HCl) gas, and $NH_3$ gas. The "growth inhibition layer 20" can also be called an "anti-surfactant layer" or a "mask layer". Also, "the growth inhibition portions 20a are randomly scattered" as used herein means that the growth inhibition portions 20a are formed randomly, irregularly, disorderly, discontinuously, or discretely in a dispersed manner so as to form the openings 20b in which the main surface 10s of the base substrate 10 is exposed. Specifically, this means that the growth inhibition portions 20a are formed in the manner of patches, islands, or a mesh, for example.

A metal nitride layer is formed as the growth inhibition layer 20, for example. Specifically, a silicon nitride (SiN) layer is formed as the growth inhibition layer 20, for example. The SiN layer can stably function as the growth inhibition layer 20 even under the crystal growth conditions of the group III nitride semiconductor.

In the present embodiment, for example, the SiN layer is formed as the growth inhibition layer 20 by heating the base substrate 10 up to a growth temperature in the first step S200, described later, in a vapor phase growth apparatus, and supplying $SiH_2Cl_2$ gas and $NH_3$ gas to the heated base substrate 10. In this step, a Ga source material is not supplied.

In the present embodiment, the growth inhibition layer 20 is formed so as to cause three-dimensional growth of the first layer 30 in the first step S200 described later so that a c-plane 30c disappears from the top surface 30u of the first layer 30, for example. Also, in the present embodiment, the growth inhibition layer 20 is formed such that an average distance L between closest peaks in the first layer 30 is greater than 50 μm in the first step S200 described later, for example.

Specifically, at this time, the $SiH_2Cl_2$ gas is supplied in an amount of $4.4 \times 10^{-10}$ mol/min or more and $1.4 \times 10^{-8}$ mol/min or less, for example. Such a minute amount of $SiH_2Cl_2$ gas can be supplied by, for example, supplying about 10 sccm of $SiH_2Cl_2$ gas diluted with $H_2$ gas to a concentration of 1 ppm or more and 30 ppm or less, from a gas cylinder. Thus, $SiH_2Cl_2$ gas can be supplied in an amount within the above-described range.

If the amount of supplied $SiH_2Cl_2$ gas is less than $4.4 \times 10^{-10}$ mol/min, the coverage rate of the growth inhibition portions 20a with respect to the main surface 10s of the base substrate 10 may be excessively low. Accordingly, three-dimensional growth of the first layer 30 may be not sufficiently promoted. In contrast, in the present embodiment, the $SiH_2Cl_2$ gas is supplied in an amount of $4.4 \times 10^{-10}$ mol/min or more, and therefore, it can be ensured that the coverage rate of the growth inhibition portions 20a with respect to the main surface 10s of the base substrate 10 is at least a predetermined value. As a result, three-dimensional growth of the first layer 30 can be promoted due to the growth inhibition layer 20. On the other hand, if the amount of supplied $SiH_2Cl_2$ gas is greater than $1.4 \times 10-8$ mol/min, the coverage rate of the growth inhibition portions 20a with respect to the main surface 10s of the base substrate 10 may be excessively high. Accordingly, the growth of the first layer 30 may be hindered over the entire main surface 10s of the base substrate 10 in the first step S200 described later.

In contrast, in the present embodiment, the $SiH_2Cl_2$ gas is supplied in an amount of $1.4 \times 10^{-8}$ mol/min or less, and therefore, the growth inhibition portions 20a can be scattered over the entire main surface 10s of the base substrate 10 and it is possible to suppress an excessive increase in the coverage rate of the growth inhibition portions 20a with respect to the main surface 10s of the base substrate 10. Accordingly, the openings 20b can be randomly formed in the growth inhibition layer 20 to expose the main surface 10s of the base substrate 10 in the openings 20b. As a result, the first layer 30 can be caused to grow three-dimensionally on the main surface 10s of the base substrate 10 via the openings 20b of the growth inhibition layer 20 in the first step S200 described later.

Further, at this time, a gas supply period for which the $SiH_2Cl_2$ gas and the $NH_3$ gas are supplied is 30 sec or more and 60 sec or less, for example. If the gas supply period is shorter than 30 sec, the coverage rate of the growth inhibition portions 20a with respect to the main surface 10s of the base substrate 10 may be excessively low. In contrast, in the present embodiment, the gas supply period is 30 sec or more, and therefore, it can be ensured that the coverage rate of the growth inhibition portions 20a with respect to the main surface 10s of the base substrate 10 is at least a predetermined value. On the other hand, if the gas supply period is longer than 60 sec, the coverage rate of the growth inhibition portions 20a with respect to the main surface 10s of the base substrate 10 may be excessively high. In contrast, in the present embodiment, the gas supply period is 60 sec or less, and therefore, the growth inhibition layer 20 can be scattered over the entire main surface 10s of the base substrate 10 and it is possible to suppress an excessive increase in the coverage rate of the growth inhibition portions 20a with respect to the main surface 10s of the base substrate 10.

S200: First Step (First Layer Growth Step, Three-Dimensional Growth Step)

After the growth inhibition layer 20 is formed, a single crystal of a group III nitride semiconductor is epitaxially grown on the main surface 10s of the base substrate 10 using the vapor phase growth apparatus in a state where the base substrate 10 on which the growth inhibition layer 20 has been formed is placed in the vapor phase growth apparatus.

Figure 3C:
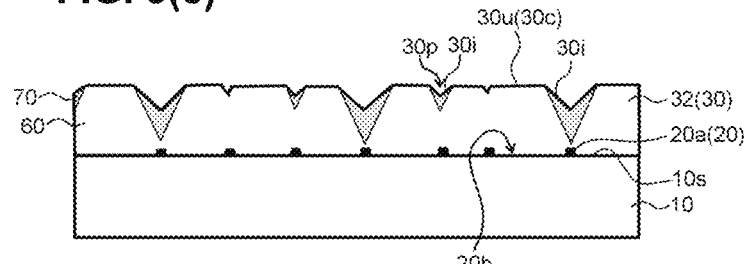
Figure 3D:
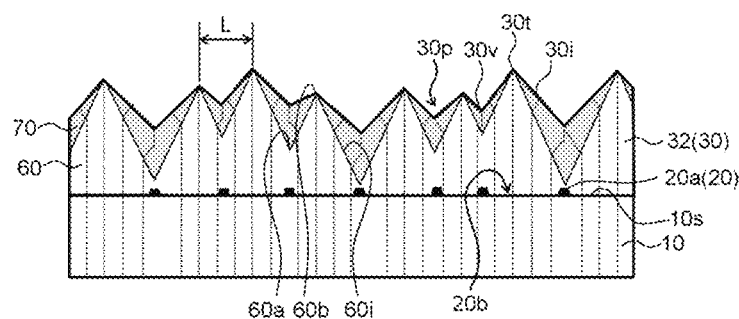
Figure 4:
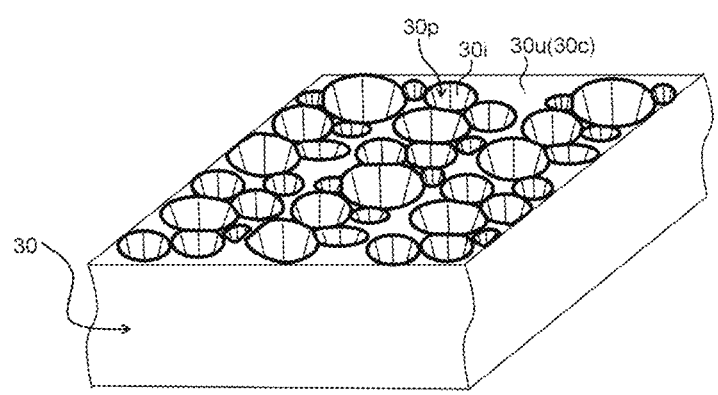
FIG. 4 is a schematic perspective view illustrating a part of the method for manufacturing a nitride semiconductor substrate according to the first embodiment of the present disclosure.

At this time, as illustrated in FIGS. 3(c), 3(d), and 4, the single crystal of the group III nitride semiconductor that has the top surface 30u at which the c-plane 30c is exposed is epitaxially grown on the main surface 10s of the base substrate 10 via the openings 20b of the growth inhibition layer 20. Thereby, the first layer (three-dimensional growth layer) 30 is grown.

At this time, due to the growth inhibition layer 20, a plurality of recessed portions 30p surrounded by inclined interfaces 30i other than the c-plane are generated in the top surface 30u of the single crystal, and the inclined interfaces 30i are gradually expanded and the c-plane 30c is gradually contracted toward an upper side of the main surface 10s of the base substrate 10. Thereby, the c-plane 30c disappears from the top surface 30u. As a result, the first layer 30 whose surface is constituted only by the inclined interfaces 30i is grown.

That is, in the first step S200, the first layer 30 is three-dimensionally grown so as to intentionally roughen the main surface 10s of the base substrate 10. Even though the first layer 30 is grown in such a manner, the first layer 30 is grown as a single crystal as described above. In this respect, the first layer 30 differs from a so-called low temperature growth buffer layer that is formed as an amorphous layer or a polycrystal on a dissimilar substrate such as sapphire before a group III nitride semiconductor is epitaxially grown on the dissimilar substrate.

In the present embodiment, for example, a layer that is constituted by the same group III nitride semiconductor as the group III nitride semiconductor constituting the base substrate 10 is epitaxially grown as the first layer 30. Specifically, for example, a GaN layer is epitaxially grown as the first layer 30 by heating the base substrate 10 and supplying GaCl gas and $NH_3$ gas to the heated base substrate 10 by the HVPE method using the above-described vapor phase growth apparatus.

Here, when a condition under which the first layer 30 is grown in the first step S200 is referred to as a "first growth condition", in order to realize the above-described growth process, the first growth condition is set such that, for example, formula (1) described below is satisfied due to the growth inhibition layer 20.

Figure 7A:
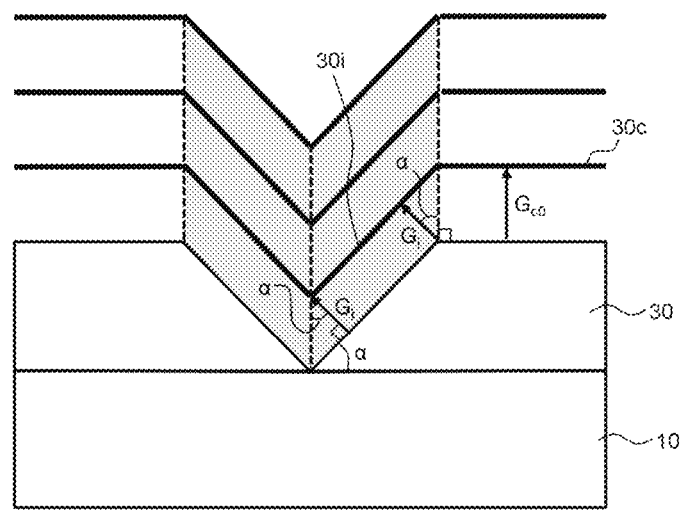
FIG. 7(a) is a schematic cross-sectional view illustrating a growth process under a reference growth condition under which an inclined interface and a c-plane are neither expanded nor contracted.

First, a reference growth condition under which the inclined interface 30i and the c-plane 30c are neither expanded nor contracted will be described with reference to FIG. 7(a). FIG. 7(a) is a schematic cross-sectional view illustrating a growth process under the reference growth condition under which the inclined interface and the c-plane are neither expanded nor contracted.

In FIG. 7(a), a thick solid line indicates the surface of the first layer 30 for each unit time. The inclined interface 30i illustrated in FIG. 7(a) is the inclined interface that is most inclined with respect to the c-plane 30c. Further, in FIG. 7(a), $G_{c0}$ represents a growth rate of the c-plane 30c of the first layer 30, $G_i$ represents a growth rate of the inclined interface 30i of the first layer 30, and a represents an angle formed by the c-plane 30c and the inclined interface 30i in the first layer 30. Also, in FIG. 7(a), the first layer 30 grows while maintaining the angle α formed by the c-plane 30c and the inclined interface 30i. The off-angle of the c-plane 30c of the first layer 30 is negligible as compared with the angle α formed by the c-plane 30c and the inclined interface 30i.

As illustrated in FIG. 7(a), when each of the inclined interface 30i and the c-plane 30c is neither expanded nor contracted, a locus of an intersection between the inclined interface 30i and the c-plane 30c is perpendicular to the c-plane 30c. Therefore, the reference growth condition under which each of the inclined interface 30i and the c-plane 30c is neither expanded nor contracted satisfies the following formula (a).

$$G_{c0}=G_i/\cos\alpha \tag{a}$$

Figure 7B:
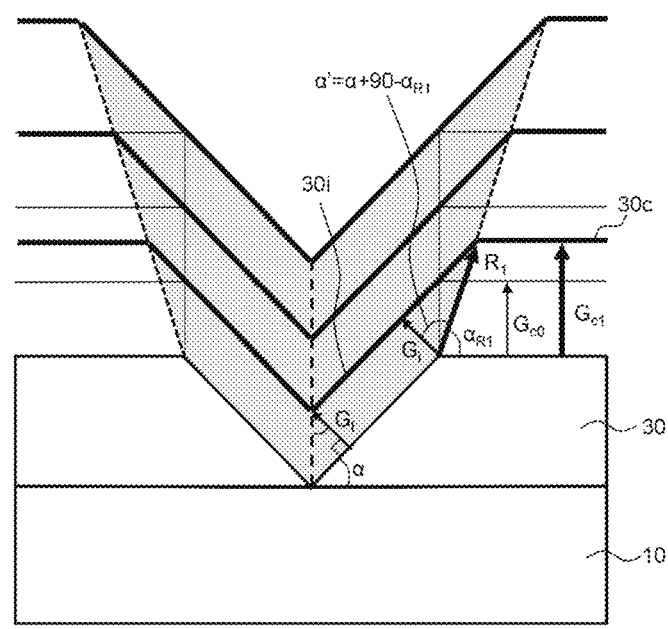
FIG. 7(b) is a schematic cross-sectional view illustrating a growth process under a first growth condition under which the inclined interface is expanded and the c-plane is contracted.

Next, the first growth condition under which the inclined interface 30i is expanded and the c-plane 30c is contracted will be described with reference to FIG. 7(b). FIG. 7(b) is a schematic cross-sectional view illustrating a growth process under the first growth condition under which the inclined interface is expanded and the c-plane is contracted.

In FIG. 7(b), as in FIG. 7(a), a thick solid line indicates the surface of the first layer 30 for each unit time. Further, the inclined interface 30i illustrated in FIG. 7(b) is also the inclined interface most inclined with respect to the c-plane 30c. Also, in FIG. 7(b), $G_{c1}$ represents a growth rate of the c-plane 30c of the first layer 30, and $R_1$ represents a progress rate of the locus of the intersection between the inclined interface 30i and the c-plane 30c of the first layer 30. Further, $\alpha_{R1}$ represents a narrower angle of angles formed by the c-plane 30c and the locus of the intersection between the inclined interface 30i and the c-plane 30c. When α' represents an angle formed by $R_1$ direction and $G_i$ direction, $\alpha'=\alpha+90-\alpha_{R1}$ is satisfied. The off-angle of the c-plane 30c of the first layer 30 is negligible as compared with the angle α formed by the c-plane 30c and the inclined interface 30i.

As illustrated in FIG. 7(b), the progress rate $R_1$ of the locus of the intersection between the inclined interface 30i and the c-plane 30c is represented by the following formula (b).

$$R_1=G_i/\cos\alpha' \tag{b}$$

Further, the growth rate $G_{c1}$ of the c-plane 30c of the first layer 30 is represented by the following formula (c).

$$G_{c1}=R_1\sin\alpha_{R1} \tag{c}$$

By substituting the formula (b) into the formula (c), Gc is represented by the following formula (d) using $G_i$.

$$G_{c1}=G_i\sin\alpha_{R1}/\cos(\alpha+90-\alpha_{R1}) \tag{d}$$

In order for the inclined interface 30i to expand and the c-plane 30c to contract, $\alpha_{R1}<90°$ is preferable. Accordingly, the first growth condition under which the inclined interface 30i is expanded and the c-plane 30c is contracted preferably satisfies the following formula (1), due to satisfying formula (d) and $\alpha_{R1}<90°$, $$G_{c1}>G_i/\cos\alpha \tag{1}$$

wherein, as described above, $G_i$ represents the growth rate of the inclined interface 30i most inclined with respect to the c-plane 30c and a represents the angle formed by the inclined interface 30i most inclined with respect to the c-plane 30c, and the c-plane 30c.

Alternatively, it can be considered that $G_{c1}$ under the first growth condition is preferably larger than Goo under the reference growth condition. In this respect as well, the formula (1) can be derived by substituting the formula (a) into $G_{c1}>G_{c0}$.

Since the growth condition for expanding the inclined interface 30i most inclined with respect to the c-plane 30c is the strictest condition, when the first growth condition satisfies the formula (1), the other inclined interfaces 30i can also be expanded.

Specifically, for example, when the inclined interface 30i most inclined with respect to the c-plane 30c is the {10-11} plane, α=61.95°. Accordingly, the first growth condition preferably satisfies, for example, the following formula (1').

$$G_{c1}>2.13G_i \tag{1'}$$

Alternatively, for example, when inclined interfaces 30i are {11-2m} planes satisfying m≥3 as described later, the inclined interface 30i most inclined with respect to the c-plane 30c is the {11-23} plane, and therefore, α=47.3°. Accordingly, the first growth condition preferably satisfies, for example, the following formula (1").

$$G_{c1}>1.47G_i \tag{1"}$$

As described above, in the present embodiment, spontaneous three-dimensional growth of the first layer 30 can be promoted due to the growth inhibition layer 20. Therefore, even when the range of the first growth condition is increased, the first growth condition can satisfy the formula (1). Specifically, as the first growth condition, at least any of the growth temperature in the first step S200, a ratio (hereinafter also referred to as "V/III ratio") of a partial pressure of $NH_3$ gas serving as a nitrogen source gas to a partial pressure of GaCl gas serving as a group III source gas in the first step S200, and the like can be made substantially equal to a second growth condition in the second step S300, which will be described later, for example.

When the first growth condition is made substantially equal to the second growth condition, as the first growth condition, the growth temperature in the first step S200 is set to 990° C. or higher and 1,120° C. or lower, and preferably 1,020° C. or higher and 1,100° C. or lower.

In this case, as the first growth condition, the V/III ratio in the first step S200 is set to 1 or more and 10 or less, and preferably 1 or more and 5 or less.

However, if the effect of the growth inhibition layer 20 promoting three-dimensional growth of the first layer 30 is insufficient or the three-dimensional growth of the first layer 30 is to be further promoted, the first growth condition, which is the growth temperature in the first step S200, the V/III ratio in the first step S200, or the like, may be set to be different from the second growth condition in the second step S300 described later, so that the first growth condition satisfies the formula (1) without only depending on the growth inhibition layer 20.

In this case, as the first growth condition, for example, the growth temperature in the first step S200 may be lower than the growth temperature in the second step S300 described later. Specifically, the growth temperature in the first step S200 may be, for example, 980° C. or higher and 1,020° C. or lower, preferably 1,000° C. or higher and 1,020° C. or lower.

Further, in this case, as the first growth condition, for example, the V/III ratio in the first step S200 may be larger than the V/III ratio in the second step S300 described later. Specifically, the V/III ratio in the first step S200 may be, for example, 2 or more and 20 or less, preferably 2 or more and 15 or less.

Other conditions of the first growth condition according to the present embodiment are as follows, for example.

Growth pressure: 90 to 105 kPa, preferably 90 to 95 kPa
Partial pressure of GaCl gas: 1.5 to 15 kPa
$N_2$ gas flow rate/$H_2$ gas flow rate: 0 to 1

Here, the first step S200 of the present embodiment is classified into two steps based on the form of the first layer 30 while growing, for example. Specifically, the first step S200 of the present embodiment includes, for example, an inclined interface expansion step S220 and an inclined interface maintenance step S240. Through these steps, for example, an expanded inclined interface layer 32 and an inclined interface maintaining layer 34 are formed as the first layer 30.

S220: Inclined Interface Expansion Step

First, as illustrated in FIGS. 3(c) and 4, the expanded inclined interface layer 32 of the first layer 30 constituted by a single crystal of a group III nitride semiconductor is epitaxially grown on the main surface 10s of the base substrate 10 via the openings 20b of the growth inhibition layer 20.

In the initial stage of growth of the expanded inclined interface layer 32, the expanded inclined interface layer 32 grows on the main surface 10s of the base substrate 10 exposed in the openings 20b of the growth inhibition layer 20, in a normal direction (direction along the c-axis) of the main surface 10s of the base substrate 10, with the c-plane 30c as a growth surface. On the other hand, crystal growth is suppressed above the growth inhibition portions 20a.

By gradually growing the expanded inclined interface layer 32, the expanded inclined interface layer 32 grows so as to cover the growth inhibition portions 20a as illustrated in FIG. 3(c) and FIG. 4. At this time, due to the growth inhibition layer 20, a plurality of recessed portions 30p formed by the inclined interfaces 30i other than the c-plane are generated in the top surface 30u of the expanded inclined interface layer 32 at which the c-plane 30c is exposed. The plurality of recessed portions 30p formed by the inclined interfaces 30i other than the c-plane are randomly formed in the top surface 30u. Thereby, the expanded inclined interface layer 32 is formed, in which the c-plane 30c and the inclined interfaces 30i other than the c-plane coexist at the surface. Positions of the recessed portions 30p in a plan view may overlap the growth inhibition portions 20a, but do not necessarily have to overlap the growth inhibition portions 20a.

The term "inclined interface 30i" as used herein means a growth interface inclined with respect to the c-plane 30c, and includes low-index facets other than the c-plane, high-index facets other than the c-plane, and inclined faces that cannot be represented by indices of crystal plane (Miller indices). Facets other than the c-plane are, for example, {11-2m}, {1-10n}, and the like. Wherein m and n are integers other than 0.

In the present embodiment, since the first growth condition satisfies the formula (1) due to the growth inhibition layer 20, for example, a {11-2m} plane satisfying m≥3 can be generated as the inclined interface 30i. Thereby, an inclination angle of the {11-2m} plane with respect to the c-plane 30c can be made moderate. Specifically, the inclination angle can be 47.3° or less.

By further growing the expanded inclined interface layer 32, as illustrated in FIGS. 3(c) and 3(d), the inclined interfaces 30i other than the c-plane are gradually expanded and the c-plane 30c is gradually contracted toward the upper side of the base substrate 10 due to the growth inhibition layer 20. At this time, the inclination angle formed by the inclined interfaces 30i with respect to the main surface 10s of the base substrate 10 gradually decreases toward the upper side of the base substrate 10. Thereby, most of the inclined interfaces 30i finally become {11-2m} planes satisfying m≥3 as described above.

When the expanded inclined interface layer 32 is further grown, the c-plane 30c of the expanded inclined interface layer 32 disappears from the top surface 30u, and the surface of the expanded inclined interface layer 32 is constituted only by the inclined interfaces 30i.

In this way, by forming a plurality of recessed portions 30p by the inclined interfaces 30i other than the c-plane in the top surface 30u of the expanded inclined interface layer 32 and making the c-plane 30c disappear, as illustrated in FIG. 3(d), a plurality of valleys 30v and a plurality of peaks 30t are formed on the surface of the expanded inclined interface layer 32. The plurality of valleys 30v are each an inflection point that is convex downward in the surface of the expanded inclined interface layer 32, and are formed above positions at which the inclined interfaces 30i other than the c-plane are generated. On the other hand, the plurality of peaks 30t are each an inflection point that is convex upward in the surface of the expanded inclined interface layer 32, and are formed at or above positions at which the c-plane 30c (finally) disappears and terminates between a pair of inclined interfaces 30i that expand in opposite directions. The valleys 30v and the peaks 30t are formed alternately in a direction extending along the main surface 10s of the base substrate 10.

Due to the growth process of the expanded inclined interface layer 32 described above, dislocations bend and propagate as follows. Specifically, as illustrated in FIG. 3(d), a plurality of dislocations extending along the c-axis in the base substrate 10 propagate from the base substrate 10 in a direction extending along the c-axis of the expanded inclined interface layer 32. In a region of the expanded inclined interface layer 32 that has grown with the c-plane 30c as a growth surface, the dislocations propagate in the direction extending along the c-axis of the expanded inclined interface layer 32. However, when the growth surface at which the dislocations are exposed changes from the c-plane 30c to an inclined interface 30i in the expanded inclined interface layer 32, the dislocations bend and propagate in a direction that is substantially perpendicular to the inclined interface 30i. That is, the dislocations bend and propagate in a direction that is inclined with respect to the c-axis. Thereby, in the steps after the inclined interface expansion step S220, the dislocations are locally collected above substantially the center between each pair of peaks 30t. As a result, a dislocation density in the surface of the second layer 40, which will be described later, can be lowered.

Although the coverage rate of the growth inhibition portions 20a with respect to the main surface 10s of the base substrate 10 is low, some of the plurality of dislocations extending along the c-axis in the base substrate 10 are blocked by the growth inhibition portions 20a and are kept from propagating to the expanded inclined interface layer 32. For this reason as well, the dislocation density in the surface of the second layer 40 described later can be lowered.

At this time, in the present embodiment, when an arbitrary cross section perpendicular to the main surface 10s of the base substrate 10 is observed, an average distance (also called "an average distance between closest peaks") L between a pair of peaks 30t spaced apart from each other in a direction extending along the main surface 10s of the base substrate 10 is, for example, greater than 50 μm, preferably greater than 70 μm, and more preferably greater than 100 μm, the pair of peaks being closest to each other among the plurality of peaks 30t with one of the plurality of valleys 30v sandwiched between them. At this time, the average distance L between closest peaks is made greater than 50 μm, preferably greater than 70 μm, and more preferably greater than 100 μm, due to the growth inhibition layer 20. If the average distance L between closest peaks is 50 μm or less as in the case where fine hexagonal pyramid-shaped crystal nuclei are generated on the main surface 10s of the base substrate 10 from the initial stage of the inclined interface expansion step S220, a distance by which the dislocations bend and propagate in the steps after the inclined interface expansion step S220 becomes short. Therefore, the dislocations cannot be sufficiently collected above substantially the center between each pair of peaks 30t of the expanded inclined interface layer 32. As a result, the dislocation density in the surface of the second layer 40 described later may not be sufficiently lowered. In contrast, in the present embodiment, since the average distance L between closest peaks is greater than 50 μm, at least a distance longer than 25 μm can be secured for the dislocations to bend and propagate in the steps after the inclined interface expansion step S220. Thereby, the dislocations can be sufficiently collected above substantially the center between each pair of peaks 30t of the expanded inclined interface layer 32. As a result, the dislocation density in the surface of the second layer 40 described later can be sufficiently lowered. When the average distance L between closest peaks is in the preferable range of greater than 70 μm, or the more preferable range of greater than 100 μm, the dislocation density in the surface of the second layer 40 described later can be more reliably lowered.

On the other hand, in the present embodiment, the average distance L between closest peaks is less than 800 μm, due to the growth inhibition layer 20. If the average distance L between closest peaks is 800 μm or more, the height from the valley 30v to the peak 30t of the expanded inclined interface layer 32 becomes excessively large. Therefore, the thickness of the second layer 40 until the second layer is mirror-finished in the second step S300 described later becomes thick. In contrast, in the present embodiment, since the average distance L between closest peaks is less than 800 μm, the height from the valley 30v to the peak 30t of the expanded inclined interface layer 32 can be lowered. Therefore, the second layer 40 can be quickly mirror-finished in the second step S300 described later.

Further, at this time, a first c-plane growth region 60 grown with the c-plane 30c as a growth surface and an inclined interface growth region 70 (gray part in the figure) grown with the inclined interfaces 30i other than the c-plane as growth surfaces, are formed in the expanded inclined interface layer 32, based on a difference in growth surfaces during the growth process.

Further, at this time, in the first c-plane growth region 60, valleys 60a are formed at positions where inclined interfaces 30i are generated, and mountains 60b are formed at positions where the c-plane 30c disappears. Further, in the first c-plane growth region 60, a pair of inclined portions 60i are formed on opposite sides of each mountain 60b as loci of intersections between the c-plane 30c and inclined interfaces 30i.

Further, at this time, an angle β formed by the pair of inclined portions 60i is, for example, 70° or less in a cross section taken along a plane that passes through centers of two adjacent valleys 60a, due to the first growth condition satisfying the formula (1).

Details of these regions will be described later.

S240: Inclined Interface Maintenance Step

Figure 5A:
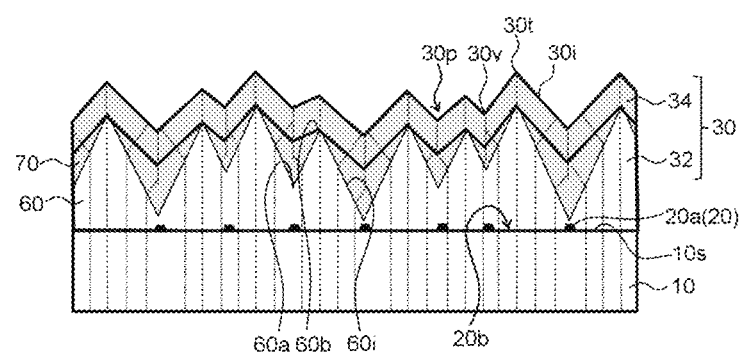
FIGS. 5(a) to 5(b) are schematic cross-sectional views illustrating a part of the method for manufacturing a nitride semiconductor substrate according to the first embodiment of the present disclosure.

After the c-plane 30c disappears from the surface of the expanded inclined interface layer 32 due to the growth inhibition layer 20, as illustrated in FIG. 5(a), the growth of the first layer 30 is continued over a predetermined thickness while a state where the inclined interfaces 30i occupy a larger portion of the surface than the c-plane 30c, or preferably a state where the surface is constituted only by the inclined interfaces 30i is maintained due to the growth inhibition layer 20. Thereby, the inclined interface maintaining layer 34 that has a surface in which the inclined interfaces 30i occupy a larger portion than the c-plane 30c, or preferably a surface that does not include the c-plane and is constituted only by the inclined interfaces 30i is formed on the expanded inclined interface layer 32. By forming the inclined interface maintaining layer 34, it is possible to make sure that the c-plane 30c disappears over the entire surface of the first layer 30. Note that a part in which the c-plane 30c is generated may be formed in the growth process of the inclined interface maintaining layer 34.

Here, in order to reliably bend the propagation direction of dislocations in the first step S200 as described above to lower the dislocation density, it is important that the c-plane 30c disappears at least once in a history of a growth interface at an arbitrary position in the first layer 30. Therefore, it is desirable that the c-plane 30c disappears at least once in an early stage of the first step S200 (e.g., in the inclined interface expansion step S220 described above).

However, the c-plane 30c may reappear in a part of the surface of the inclined interface maintaining layer 34 in the inclined interface maintenance step S240 after the c-plane 30c has disappeared at least once. However, it is preferable to mainly expose the inclined interfaces 30i at the surface of the inclined interface maintaining layer 34, so that an area ratio of the inclined interface growth region 70 is 80% or more in a cross section taken along the main surface 10s of the base substrate 10. The higher the area ratio occupied by the inclined interface growth region 70 in the cross section, the better, and it is preferable that the area ratio is 100%.

At this time, in the inclined interface maintenance step S240 as well, the first growth condition is maintained so that the formula (1) is satisfied due to the growth inhibition layer 20 similarly to the inclined interface expansion step S220. Thereby, the inclined interface maintaining layer 34 can grow, with only the inclined interfaces 30i as growth surfaces.

Further, at this time, by growing the inclined interface maintaining layer 34 with the inclined interfaces 30i as growth surfaces, the dislocations that bend and propagate in the direction inclined with respect to the c-axis at positions where the inclined interfaces 30i are exposed in the inclined interface expanding layer 32 as described above continue to propagate in the same direction in the inclined interface maintaining layer 34.

Further, at this time, the inclined interface maintaining layer 34 grows with the inclined interfaces 30i as growth surfaces, and accordingly, the entire inclined interface maintaining layer 34 becomes a part of the inclined interface growth region 70.

Through the first step S200 described above, the first layer 30 including the expanded inclined interface layer 32 and the inclined interface maintaining layer 34 is formed.

In the first step S200 of the present embodiment, the height from the main surface 10s of the base substrate 10 to the peak 30t of the first layer 30 (the maximum height in the thickness direction of the first layer 30) is, for example, greater than 100 µm and less than 1.5 mm, as a result of the first layer 30 being three-dimensionally grown due to the growth inhibition layer 20.

In a case where the first growth condition, which is the growth temperature in the first step S200, the V/III ratio in the first step S200, or the like, is substantially equal to the second growth condition in the second step S300 described later, as described above, the mode of crystal growth spontaneously transitions from that in the first step S200 to that in the second step S300.

S300: Second Step (Second Layer Growth Step, Flattening Step)

Figure 5B:
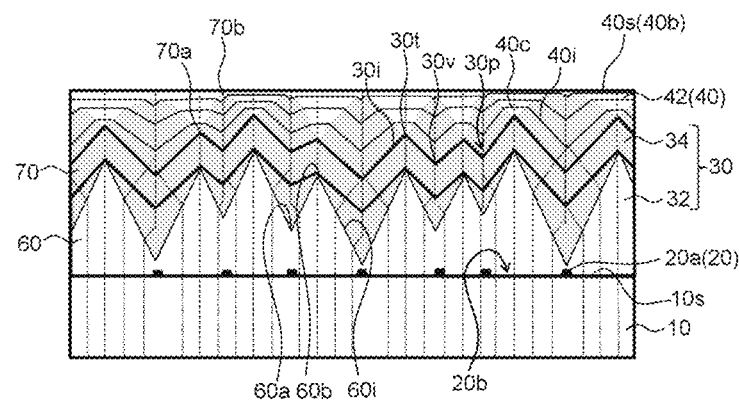
Figure 6A:
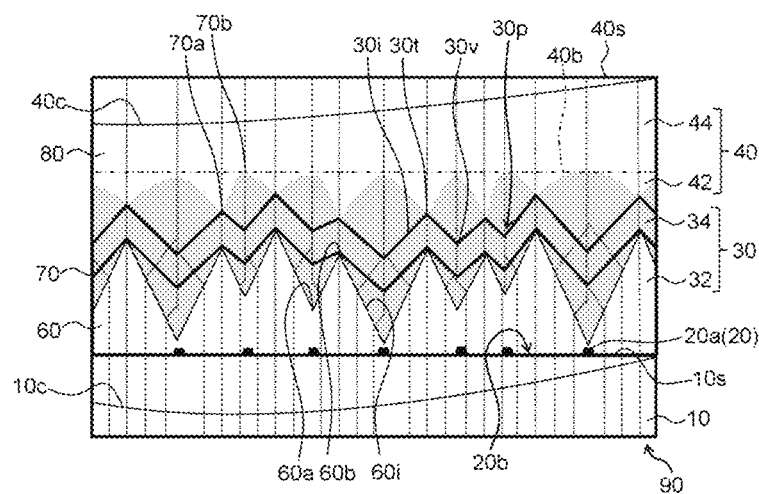
FIGS. 6(a) to 6(b) are schematic cross-sectional views illustrating a part of the method for manufacturing a nitride semiconductor substrate according to the first embodiment of the present disclosure.

After the first layer 30 in which the c-plane 30c has disappeared is grown, a single crystal of a group III nitride semiconductor is further epitaxially grown on the first layer 30 as illustrated in FIGS. 5(b) and 6(a).

At this time, inclined interfaces 40i are gradually contracted and a c-plane 40c is gradually expanded toward the upper side of the first layer 30. Thereby, the inclined interfaces 30i formed at the surface of the first layer 30 disappear. As a result, the second layer (flattening layer) 40 including a mirror-finished surface is grown. The "mirror surface (mirror-finished surface)" as used herein means a surface in which the largest difference in height between a recessed portion and a raised portion of the surface that are adjacent to each other is no greater than a wavelength of visible light.

In the present embodiment, for example, a layer that is mainly composed of the same group III nitride semiconductor as the group III nitride semiconductor constituting the first layer 30 is epitaxially grown as the second layer 40. In the second step S300, a silicon (Si)-doped GaN layer is epitaxially grown as the second layer 40 by supplying GaCl gas, $NH_3$ gas, and dichlorosilane ($SiH_2Cl_2$) gas as an n-type dopant gas to the base substrate 10 heated to a predetermined growth temperature. As the n-type dopant gas, $GeCl_4$ gas or the like may be supplied instead of the $SiH_2Cl_2$ gas.

Here, when a condition under which the second layer 40 is grown in the second step S300 is referred to as the "second growth condition", in order to realize the above-described growth process, the second growth condition is set so as to satisfy, for example, formula (2) described below.

Figure 8:
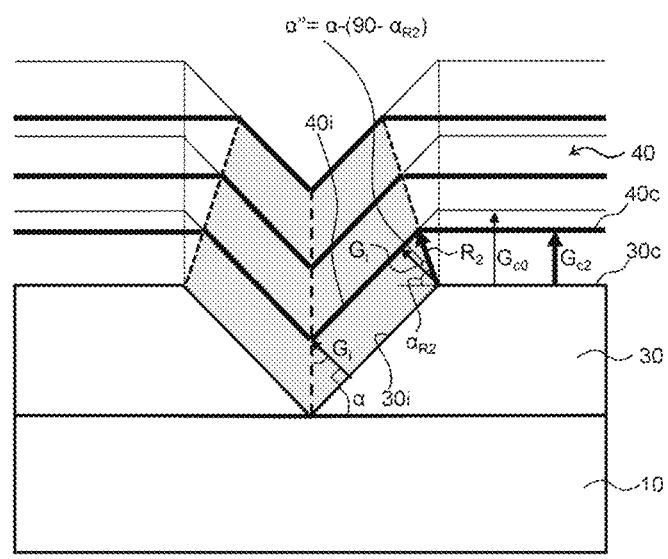
FIG. 8 is a schematic cross-sectional view illustrating a growth process under a second growth condition under which the inclined interface is contracted and the c-plane is expanded.

The second growth condition under which the inclined interface 40i is contracted and the c-plane 40c is expanded will be described with reference to FIG. 8. FIG. 8 is a schematic cross-sectional view illustrating a growth process under the second growth condition under which the inclined interface is contracted and the c-plane is expanded. FIG. 8 illustrates a process of the second layer 40 growing on the first layer 30 where an inclined interface 30i that is most inclined with respect to the c-plane 30c is exposed.

In FIG. 8, as in FIG. 7(a), the thick solid line indicates the surface of the second layer 40 for each unit time. Further, in FIG. 8, $G_{c2}$ represents a growth rate of the c-plane 40c of the second layer 40, $G_i$ represents a growth rate of the inclined interface 40i of the second layer 40, and $R_2$ represents a progress rate of a locus of an intersection between the inclined interface 40i and the c-plane 40c in the second layer 40. Further, $\alpha_{R2}$ represents a narrower angle of angles formed by the c-plane 30c and the locus of the intersection between the inclined interface 40i and the c-plane 40c. When $\alpha''$ represents an angle formed by $R_2$ direction and $G_i$ direction, $\alpha''=\alpha-(90-\alpha_{R2})$ is satisfied. Further, in FIG. 8, the second layer 40 grows while maintaining the angle $\alpha$ formed by the c-plane 30c and the inclined interface 30i in the first layer 30. The off-angle of the c-plane 40c of the second layer 40 is negligible as compared with the angle $\alpha$ formed by the c-plane 30c and the inclined interface 30i.

As illustrated in FIG. 8, the progress rate $R_2$ of the locus of the intersection between the inclined interface 40i and the c-plane 40c is represented by the following formula (e).

$$R_2 = G_i / \cos\alpha'' \tag{e}$$

Further, the growth rate $G_{c2}$ of the c-plane 40c of the second layer 40 is represented by the following formula (f).

$$G_{c2} = R_2 \sin\alpha_{R2} \tag{f}$$

By substituting the formula (e) into the formula (f), $G_{c2}$ is represented by the following formula (g) using $G_i$.

$$G_{c2} = G_i \sin\alpha_{R2} / \cos(\alpha+\alpha_{R2}-90) \tag{g}$$

In order for the inclined interface 40i to contract and the c-plane 40c to expand, $\alpha_{R2} < 90°$ is preferable. Accordingly, the second growth condition under which the inclined interface 40i is contracted and the c-plane 40c is expanded preferably satisfies the following formula (2), due to satisfying the formula (g) and $\alpha_{R2} < 90°$, $$G_{c2} < G_i / \cos\alpha \tag{2}$$

wherein, as described above, $G_i$ represents the growth rate of the inclined interface 40i most inclined with respect to the c-plane 40c, and $\alpha$ represents the angle formed by the c-plane 40c and the inclined interface 40i most inclined with respect to the c-plane 40c.

Alternatively, when the growth rate of the c-plane 30c in the second layer 40 under the reference growth condition is represented by $G_{c0}$, it can also be considered that $G_{c2}$ under the second growth condition is preferably smaller than Goo under the reference growth condition. In this respect as well, the formula (2) can be derived by substituting the formula (a) into $G_{c2} < G_{c0}$.

Since the growth condition for contracting the inclined interface 40i most inclined with respect to the c-plane 40c is the strictest condition, when the second growth condition satisfies the formula (2), the other inclined interfaces 40*i* can also be contracted.

Specifically, when the inclined interface 40*i* most inclined with respect to the c-plane 40*c* is the {10-11} plane, the second growth condition preferably satisfies the following formula (2').

$$G_{c2} < 2.13 G_i \quad (2')$$

Alternatively, for example, when the inclined interfaces 30*i* are {11-2m} planes satisfying m≥3, the inclined interface 30*i* most inclined with respect to the c-plane 30*c* is the {11-23} plane, and therefore, the second growth condition preferably satisfies, for example, the following formula (2").

$$G_{c2} < 1.47 G_i \quad (2'')$$

In the second step S300 of the present embodiment, the growth inhibition layer 20 has already lost its influence. Therefore, the second growth condition, which is the growth temperature in the second step S300, the V/III ratio in the second step, or the like is adjusted so as to satisfy the formula (2), without taking the influence of the growth inhibition layer 20 into consideration.

Specifically, as the second growth condition, the growth temperature in the second step S300 is set to, for example, 990° C. or higher and 1,120° C. or lower, preferably 1,020° C. or higher and 1,100° C. or lower.

Further, as the second growth condition, the V/III ratio in the second step S300 is set to, for example, 1 or more and 10 or less, preferably 1 or more and 5 or less.

Other conditions of the second growth condition of the present embodiment are, for example, as follows.

Growth pressure: 90 to 105 kPa, preferably 90 to 95 kPa
Partial pressure of GaCl gas: 1.5 to 15 kPa
$N_2$ gas flow rate/$H_2$ gas flow rate: 1 to 20

Here, the second step S300 of the present embodiment is classified into two steps based on the form of the second layer 40 while growing, for example. Specifically, the second step S300 of the present embodiment includes, for example, a c-plane expansion step S320 and a main growth step S340. Through these steps, for example, a c-plane expanded layer 42 and a main growth layer 44 are formed as the second layer 40.

S320: C-Plane Expansion Step

As illustrated in FIG. 5(*b*), the c-plane expanded layer 42 of the second layer 40 constituted by a single crystal of a group III nitride semiconductor is epitaxially grown on the first layer 30 under the above-described second growth condition.

At this time, the growth inhibition layer 20 has already lost its influence as described above, and accordingly, the c-plane 40*c* is expanded and the inclined interfaces 40*i* other than the c-plane are contracted toward the upper side of the first layer 30 due to growth that depends only on the second growth condition.

Specifically, due to the growth under the second growth condition, the c-plane expanded layer 42 grows from the inclined interfaces 30*i* of the inclined interface maintaining layer 34 in a direction perpendicular to the c-axis (that is, a direction extending along the surface or a lateral direction) with the inclined interfaces 40*i* as growth surfaces. When the c-plane expanded layer 42 is grown laterally, the c-plane 40*c* of the c-plane expanded layer 42 begins to be exposed again above the peaks 30*t* of the inclined interface maintaining layer 34. Thereby, the c-plane expanded layer 42 is formed, in which the c-plane 40*c* and the inclined interfaces 40*i* other than the c-plane coexist at the surface.

When the c-plane expanded layer 42 is further grown laterally, the c-plane 40*c* gradually expands, and the inclined interfaces 40*i* of the c-plane expanded layer 42 gradually contract. Thereby, the recessed portions 30*p* formed by the plurality of inclined interfaces 30*i* in the surface of the first layer 30 are gradually embedded.

Thereafter, when the c-plane expanded layer 42 is further grown, the inclined interfaces 40*i* of the c-plane expanded layer 42 completely disappear, and the recessed portions 30*p* formed by the plurality of inclined interfaces 30*i* in the surface of the first layer 30 are completely embedded. Thereby, the surface of the c-plane expanded layer 42 becomes a mirror-finished surface (flat surface) that is constituted only by the c-plane 40*c*.

At this time, the dislocation density can be lowered by locally collecting dislocations during the growth process of the first layer 30 and the c-plane expanded layer 42. Specifically, the dislocations that bend and propagate in the direction inclined with respect to the c-axis in the first layer 30 continue to propagate in the same direction in the c-plane expanded layer 42. Thereby, the dislocations are collected locally at a meeting part of adjacent inclined interfaces 40*i* above substantially the center between each pair of peaks 30*t* in the c-plane expanded layer 42. Out of a plurality of dislocations collected at meeting parts of adjacent inclined interfaces 40*i* of the c-plane expanded layer 42, dislocations that have Burgers vectors opposite to each other disappear when meeting each other. Further, some of the dislocations collected at the meeting parts of the adjacent inclined interfaces 40*i* form a loop, and the propagation along the c-axis (that is, toward the surface side of the c-plane expanded layer 42) is suppressed. The other dislocations of the plurality of dislocations collected at the meeting parts of the adjacent inclined interfaces 40*i* of the c-plane expanded layer 42 change their propagation direction again from the direction inclined with respect to the c-axis to a direction extending along the c-axis, and propagate to the surface side of the second layer 40. In this way, by making some of the plurality of dislocations disappear and suppressing propagation of some of the plurality of dislocations to the surface side of the c-plane expanded layer 42, the dislocation density in the surface of the second layer 40 can be lowered. Further, by collecting the dislocations locally, a low dislocation density region can be formed above a portion of the second layer 40 in which dislocations propagate in the direction inclined with respect to the c-axis.

Further, at this time, since the c-plane 40*c* gradually expands in the c-plane expanded layer 42, a second c-plane growth region 80 that grows with the c-plane 40*c* as a growth surface, which will be described later, is formed while gradually expanding toward the upper side in the thickness direction.

On the other hand, in the c-plane expanded layer 42, as the inclined interfaces 40*i* gradually contract, the inclined interface growth region 70 gradually contracts toward the upper side in the thickness direction, and terminates at a predetermined position in the thickness direction. Due to the above-described growth process of the c-plane expanded layer 42, valleys 70*a* of the inclined interface growth region 70 are formed at positions at which the c-plane 40*c* is generated again, in a cross-sectional view. Further, in the process of recessed portions formed by the inclined interfaces 40*i* being gradually embedded, mountains 70*b* of the inclined interface growth region 70 are formed at positions at which the inclined interfaces 40*i* disappear, in a cross-sectional view.

In the c-plane expansion step S320, the surface of the c-plane expanded layer 42 becomes a mirror-finished surface that is constituted only by the c-plane 40c, and therefore the height of the c-plane expanded layer 42 in the thickness direction (maximum height in the thickness direction) is, for example, greater than or equal to the height from the valley 30v to the peak 30t of the inclined interface maintaining layer 34.

S340: Main Growth Step (c-Plane Growth Step)

When the inclined interfaces 40i have disappeared from the c-plane expanded layer 42 and the surface has been mirror-finished, as illustrated in FIG. 6(a), the main growth layer 44 is formed on the c-plane expanded layer 42 over a predetermined thickness with the c-plane 40c as a growth surface. Thereby, the main growth layer 44 that has only the c-plane 40c on the surface without having the inclined interfaces 40i is formed.

At this time, the above-described second growth condition is maintained in the main growth step S340, similarly to the c-plane expansion step S320. Thereby, step-flow growth of the main growth layer 44 can be caused with the c-plane 40c as a growth surface.

Further, at this time, a radius of curvature of the c-plane 40c of the main growth layer 44 can be made larger than a radius of curvature of the c-plane 10c of the base substrate 10. Thereby, a variation in the off-angle of the c-axis with respect to the normal of the surface of the main growth layer 44 can be made smaller than the variation in the off-angle of the c-axis 10ca with respect to the normal of the main surface 10s of the base substrate 10.

Further, at this time, by growing the main growth layer 44 with only the c-plane 40c as a growth surface without exposing the inclined interfaces 40i, the entire main growth layer 44 is formed as the second c-plane growth region 80, which will be described later.

In the main growth step S340, the thickness of the main growth layer 44 is, for example, 300 μm or more and 10 mm or less. Since the thickness of the main growth layer 44 is 300 μm or more, at least one or more substrates 50 can be sliced from the main growth layer 44 in the slicing step S400 described later. On the other hand, if the thickness of the main growth layer 44 is 10 mm, at least ten substrates 50 can be obtained when a final thickness is 650 μm, and 700 μm-thick substrates 50 are sliced from the main growth layer 44, even if a kerf loss of about 200 μm is taken into consideration.

Through the second step S300 described above, the second layer 40 including the c-plane expanded layer 42 and the main growth layer 44 is formed. As a result, a laminated structure 90 of the present embodiment is formed.

The growth inhibition layer forming step S190, the first step S200, and the second step S300 described above are continuously performed in the same vapor phase growth apparatus without exposing the base substrate 10 to the atmosphere. Thereby, it is possible to suppress unintended formation of a high oxygen concentration region (a region having an oxygen concentration that is excessively higher than that of the inclined interface growth region 70) at an interface between the main surface 10s of the base substrate 10 exposed in the openings 20b of the growth inhibition layer 20 and the first layer 30 and at an interface between the first layer 30 and the second layer 40.

After the second step S300 is complete, the laminated structure 90 is taken out of the vapor phase growth apparatus.

S400: Slicing Step

Figure 6B:
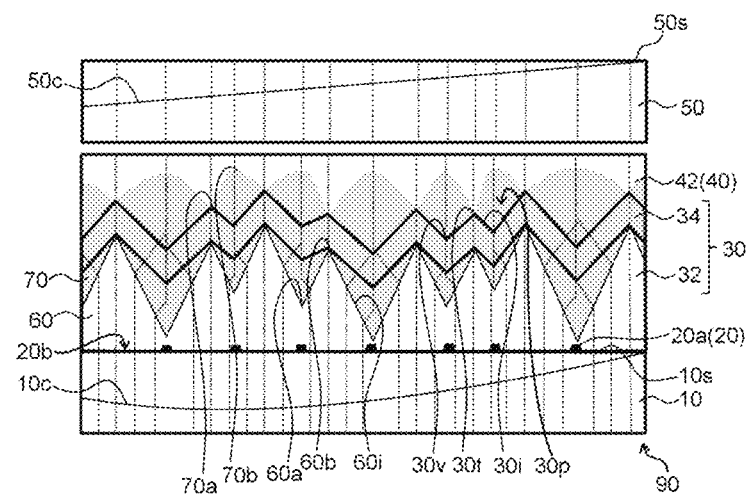

Next, as illustrated in FIG. 6(b), for example, the main growth layer 44 is sliced using a wire saw along a cut surface that is substantially parallel to the surface of the main growth layer 44. Thereby, at least one nitride semiconductor substrate 50 (also referred to as a substrate 50) as an as-sliced substrate is formed. At this time, the thickness of the substrate 50 is, for example, 300 μm or more and 700 μm or less.

At this time, the radius of curvature of a c-plane 50c of the substrate 50 can be larger than the radius of curvature of the c-plane 10c of the base substrate 10. Also, at this time, the radius of curvature of the c-plane 50c of the substrate 50 can be larger than the radius of curvature of the c-plane 40c of the main growth layer 44 before slicing. Thereby, the variation in the off-angle θ of a c-axis 50ca with respect to the normal of a main surface 50s of the substrate 50 can be smaller than the variation in the off-angle of the c-axis 10ca of the base substrate 10.

S500: Polishing Step

Next, both sides of the substrate 50 are polished using a polishing device. At this time, the thickness of the final substrate 50 is, for example, 250 μm or more and 650 μm or less.

The substrate 50 according to the present embodiment is manufactured by the above steps S100 to S500.

Step of preparing semiconductor laminate and step of preparing semiconductor device After the substrate 50 is manufactured, for example, a semiconductor functional layer that is constituted by a group III nitride semiconductor is epitaxially grown on the substrate 50 to prepare a semiconductor laminate. After the semiconductor laminate is prepared, an electrode or the like is formed using the semiconductor laminate, and the semiconductor laminate is diced, and a chip having a predetermined size is cut out. Thereby, a semiconductor device is prepared.

(2) Laminated Structure

Next, the laminated structure 90 according to the present embodiment will be described with reference to FIG. 6(a).

The laminated structure 90 of the present embodiment includes, for example, the base substrate 10, the growth inhibition layer 20, the first layer 30, and the second layer 40.

The growth inhibition layer 20 includes, for example, the growth inhibition portions 20a scattered over the entire main surface 10s of the base substrate 10.

The first layer 30 grows on, for example, the main surface 10s of the base substrate 10 via the openings 20b of the growth inhibition layer 20.

The first layer 30 includes, for example, a plurality of valleys 30v and a plurality of peaks 30t that are formed by generating a plurality of recessed portions 30p formed by inclined interfaces 30i other than the c-plane in the top surface 30u of a single crystal of a group III nitride semiconductor due to the growth inhibition layer 20 and making the c-plane 30c disappear. When an arbitrary cross section perpendicular to the main surface of the base substrate 10 is observed, an average distance between closest peaks is, for example, greater than 50 μm, and preferably greater than 70 μm.

Further, the first layer 30 includes, for example, the first c-plane growth region (first low oxygen concentration region) 60 and the inclined interface growth region (high oxygen concentration region) 70 based on a difference in growth surfaces during the growth process.

The first c-plane growth region 60 is a region that has grown with the c-plane 30c as a growth surface. The first c-plane growth region 60 includes, for example, a plurality of valleys 60a and a plurality of mountains 60b in a cross-sectional view. Each of the valleys 60a and the mountains 60b referred to herein means a part of a shape that is observed based on a difference in light emission intensity when a cross section of the laminated structure 90 is observed using a fluorescence microscope or the like, and does not mean a part of the shape of an outermost surface generated during the growth of the first layer 30. The plurality of valleys 60a are each an inflection point that is convex downward in the first c-plane growth region 60 in a cross-sectional view, and are formed at positions at which the inclined interfaces 30i are generated. At least one of the plurality of valleys 60a is provided at a position that is spaced upward from the main surface 10s of the base substrate 10. On the other hand, the plurality of mountains 60b are each an inflection point that is convex upward in the first c-plane growth region 60 in a cross-sectional view, and are formed at positions at which the c-plane 30c (finally) disappears and terminates between a pair of inclined interfaces 30i that expand in opposite directions. The valleys 60a and the mountains 60b are formed alternately in a direction extending along the main surface 10s of the base substrate 10.

When an arbitrary cross section perpendicular to the main surface 10s of the base substrate 10 is observed, an average distance between a pair of mountains 60b spaced apart from each other in the direction extending along the main surface 10s of the substrate 10 corresponds to the above-described average distance L between closest peaks of the first layer 30, and is, for example, greater than 50 μm, preferably greater than 70 μm, and more preferably greater than 100 μm, the pair of mountains 60b being closest to each other among the plurality of mountains 60b with one of the plurality of valleys 60a sandwiched between them.

The first c-plane growth region 60 includes a pair of inclined portions 60i that are formed on opposite sides of each of the plurality of mountains 60b as loci of intersections between the c-plane 30c and the inclined interfaces 30i. Each of the inclined portions 60i referred to herein means a part of a shape observed based on a difference in light emission intensity when a cross section of the laminated structure 90 is observed using a fluorescence microscope or the like, and does not mean the inclined interface 30i at the outermost surface generated during the growth of the first layer 30.

The angle β formed by the pair of inclined portions 60i in a cross section taken along a plane that passes through centers of two adjacent valleys 60a is, for example, 70° or less, and preferably 20° or more and 65° or less. The angle β formed by the pair of inclined portions 60i being 70° or less means that under the first growth condition, the ratio $G_{c1}/G_i$ is high, which is the ratio of the growth rate $G_{c1}$ of the c-plane 30c of the first layer 30 to the growth rate $G_i$ of the inclined interface 30i most inclined with respect to the c-plane 30c of the first layer 30. Thereby, the inclined interfaces 30i other than the c-plane can be easily generated. As a result, dislocations can be easily bent at positions where the inclined interfaces 30i are exposed. Further, since the angle β formed by the pair of inclined portions 60i is 70° or less, a plurality of valleys 30v and a plurality of peaks 30t can be easily generated above the main surface 10s of the base substrate 10. Further, if the angle β formed by the pair of inclined portions 60i is 65° or less, the inclined interfaces 30i other than the c-plane can be more easily generated, and the plurality of valleys 30v and the plurality of peaks 30t can be more easily generated above the main surface 10s of the base substrate 10. Also, if the angle β formed by the pair of inclined portions 60i is 20° or more, it is possible to suppress an increase in the height from the valley 30v to the peak 30t of the first layer 30 to suppress an increase in the thickness of the second layer 40 until the second layer is mirror-finished.

On the other hand, the inclined interface growth region 70 is a region grown with the inclined interfaces 30i other than the c-plane as growth surfaces. A lower surface of the inclined interface growth region 70 conforms to, for example, the shape of the first c-plane growth region 60.

The inclined interface growth region 70 is provided continuously along the main surface of the base substrate 10. That is, when a plurality of cross sections of the first layer 30 are taken along the main surface 10s of the base substrate 10, it is desirable that there is a cross section that does not include the first c-plane growth region 60 at least in a portion of the first layer 30 in its thickness direction.

In the inclined interface growth region 70, oxygen is easily taken in as compared with the first c-plane growth region 60. Therefore, the oxygen concentration in the inclined interface growth region 70 is higher than the oxygen concentration in the first c-plane growth region 60. The oxygen taken into the inclined interface growth region 70 is, for example, oxygen that is unintentionally introduced into a HVPE apparatus, oxygen that is released from a member (quartz member or the like) constituting the HVPE apparatus, or the like.

The oxygen concentration in the first c-plane growth region 60 is, for example, $5 \times 10^{16}$ cm$^{-3}$ or less, preferably $3 \times 10^{16}$ cm$^{-3}$ or less. On the other hand, the oxygen concentration in the inclined interface growth region 70 is, for example, $9 \times 10^{17}$ cm$^{-3}$ or more and $5 \times 10^{19}$ cm$^{-3}$ or less.

The second layer 40 includes, for example, the inclined interface growth region (high oxygen concentration region) 70 and the second c-plane growth region (second low oxygen concentration region) 80 based on a difference in growth surfaces during the growth process.

An upper surface of the inclined interface growth region 70 in the second layer 40 includes, for example, a plurality of valleys 70a and a plurality of mountains 70b in a cross-sectional view. Each of the valleys 70a and the mountains 70b referred to herein means a part of a shape that is observed based on a difference in light emission intensity when a cross section of the laminated structure 90 is observed using a fluorescence microscope or the like, and does not mean a part of the shape of an outermost surface generated during the growth of the second layer 40. As described above, the plurality of valleys 70a of the inclined interface growth region 70 are formed at positions at which the c-plane 40c is generated again, in a cross-sectional view. Further, the plurality of valleys 70a of the inclined interface growth region 70 are respectively formed above the plurality of mountains 60b of the first c-plane growth region 60, in the cross-sectional view. On the other hand, as described above, the plurality of mountains 70b of the inclined interface growth region 70 are formed at positions at which the inclined interfaces 40i disappear and terminate, in a cross-sectional view. Further, the plurality of mountains 70b of the inclined interface growth region 70 are respectively formed above the plurality of valleys 60a of the first c-plane growth region 60, in the cross-sectional view.

Further, a surface of the second layer 40 that is substantially parallel to the main surface 10s of the base substrate 10 at an upper end of the inclined interface growth region 70 is formed as a boundary surface 40b at a position at which the inclined interfaces 40i of the second layer 40 disappear and terminate.

The second c-plane growth region 80 is a region that has grown with the c-plane 40c as a growth surface. In the second c-plane growth region 80, oxygen uptake is suppressed as compared with the inclined interface growth region 70. Therefore, the oxygen concentration in the second c-plane growth region 80 is lower than the oxygen concentration in the inclined interface growth region 70. The oxygen concentration in the second c-plane growth region 80 is, for example, equivalent to the oxygen concentration in the first c-plane growth region 60.

In the present embodiment, in the growth process of the first layer 30, dislocations bend and propagate in a direction that is substantially perpendicular to the inclined interfaces 30$i$ other than the c-plane at positions where the inclined interfaces 30$i$ are exposed, and accordingly, in the second layer 40, some of the plurality of dislocations disappear and some of the plurality of dislocations are kept from propagating to the surface side of the c-plane expanded layer 42. Thereby, the dislocation density in the surface of the second layer 40 is lower than the dislocation density in the main surface 10$s$ of the base substrate 10.

Further, in the present embodiment, the dislocation density in the surface of the second layer 40 is sharply reduced in the thickness direction.

Here, let $N_0$ be the dislocation density in the main surface 10$s$ of the base substrate 10, and let N be a dislocation density in the boundary surface 40$b$ at the position at which the inclined interfaces 40$i$ disappear in the second layer 40. N represents an average dislocation density in the boundary surface 40$b$. On the other hand, let N' be a dislocation density in a surface of a crystal layer of a group III nitride semiconductor that is epitaxially grown on the main surface 10$s$ of the base substrate 10 so as to have a thickness equal to the thickness from the main surface of the base substrate 10 to the boundary surface 40$b$ of the present embodiment, with only the c-plane as a growth surface (hereinafter, such a case will also be referred to as "in the case of c-plane limited growth").

In the case of the c-plane limited growth, the dislocation density in the surface of the crystal layer tended to be inversely proportional to the thickness of the crystal layer. Specifically, in the case of the c-plane limited growth, when the thickness of the crystal layer is 1.5 mm, a dislocation density reduction rate N'/$N_0$ is about 0.6.

In contrast, in the present embodiment, a dislocation density reduction rate N/$N_0$ is smaller than, for example, the dislocation density reduction rate N'/$N_0$ of the case of the c-plane limited growth.

Specifically, in the present embodiment, the thickness from the main surface 10$s$ of the base substrate 10 to the boundary surface 40$b$ at the position where the inclined interfaces 40$i$ in the second layer 40 disappear is, for example, 1.5 mm or less, preferably 1.2 mm or less. Further, in the present embodiment, the above-described dislocation density reduction rate N/$N_0$ is, for example, 0.3 or less, preferably 0.23 or less, and more preferably 0.15 or less.

In the present embodiment, a lower limit of the thickness from the main surface 10$s$ of the base substrate 10 to the boundary surface 40$b$ is not limited, because the thinner, the better. However, the thickness from the main surface 10$s$ of the base substrate 10 to the boundary surface 40$b$ is, for example, greater than 200 μm, when consideration is given to processes from the generation of the inclined interfaces 30$i$ to the disappearance of the inclined interfaces 40$i$ in the first step S200 and the second step S300.

Further, in the present embodiment, a lower limit of the dislocation density reduction rate is not limited, because the smaller, the better. However, the dislocation density reduction rate is, for example, 0.01 or more, since the thickness from the main surface 10$s$ of the base substrate 10 to the boundary surface 40$b$ is 1.5 mm or less.

In addition, in the present embodiment, the entire surface of the second layer 40 is configured to be oriented to +c plane, and the first layer 30 and the second layer 40 each do not include a polarity reversal domain (inversion domain). In this respect, the laminated structure 90 of the present embodiment is different from a laminated structure that is formed by a so-called DEEP (Dislocation Elimination by the Epitaxial-growth with inverse-pyramidal Pits) method, that is, different from a laminated structure including the polarity reversal domain in a core located at the center of a pit.

(3) Nitride Semiconductor Substrate (Nitride Semiconductor Free-Standing Substrate, Nitride Crystal Substrate)

Figure 9A:
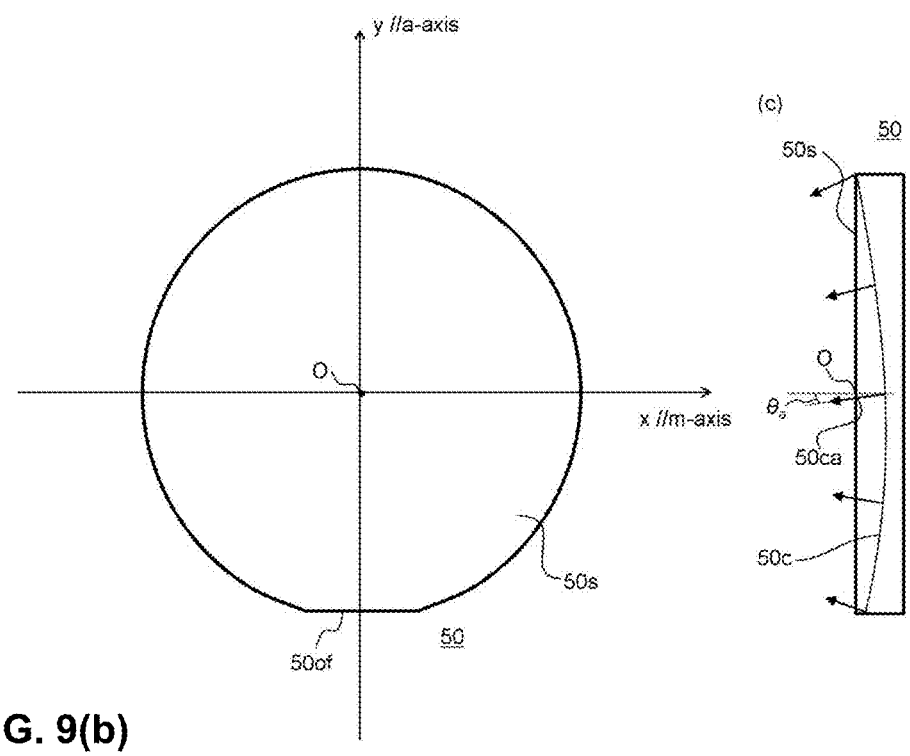
FIG. 9(a) is a schematic top view illustrating a nitride semiconductor substrate according to the first embodiment of the present disclosure.

Next, the nitride semiconductor substrate 50 according to the present embodiment will be described with reference to FIG. 9. FIG. 9($a$) is a schematic top view illustrating the nitride semiconductor substrate according to the present embodiment, FIG. 9($b$) is a schematic cross-sectional view taken along the m-axis of the nitride semiconductor substrate according to the present embodiment, and FIG. 9($c$) is a schematic cross-sectional view taken along the a-axis of the nitride semiconductor substrate according to the present embodiment.

In the present embodiment, the substrate 50 obtained by slicing the second layer 40 by the above-described manufacturing method is, for example, a free-standing substrate that is constituted by a single crystal of a group III nitride semiconductor. In the present embodiment, the substrate 50 is, for example, a GaN free-standing substrate.

The substrate 50 has a diameter of, for example, 2 inches or more. The substrate 50 has a thickness of, for example, 300 μm or more and 1 mm or less.

The conductivity of the substrate 50 is not particularly limited, but when manufacturing a semiconductor device as a vertical Schottky barrier diode (SBD) using the substrate 50, the substrate 50 is, for example, n-type, and n-type impurities in the substrate 50 are, for example, Si or germanium (Ge), and n-type impurities concentration in the substrate 50 is, for example, $1.0 \times 10^{18}$ cm$^{-3}$ or more and $1.0 \times 10^{20}$ cm$^{-3}$ or less.

The substrate 50 has, for example, the main surface 50$s$ which is an epitaxial growth surface. In the present embodiment, a low index crystal plane that is closest to the main surface 50$s$ is, for example, the c-plane 50$c$.

The main surface 50$s$ of the substrate 50 is a mirror-finished, for example, and a root mean square roughness RMS of the main surface 50$s$ of the substrate 50 is, for example, less than 1 nm.

Further, in the present embodiment, the impurity concentration in the substrate 50 obtained by the above-described manufacturing method is lower than that of a substrate obtained by a flux method, an ammonothermal method, or the like.

Specifically, a hydrogen concentration in the substrate 50 is, for example, less than $1 \times 10^{17}$ cm$^{-3}$, preferably $5 \times 10^{16}$ cm$^{-3}$ or less.

Further, in the present embodiment, the substrate 50 is formed by slicing the main growth layer 44 grown with the c-plane 40$c$ as a growth surface, and therefore does not include the inclined interface growth region 70 grown with the inclined interfaces 30$i$ or the inclined interfaces 40$i$ as growth surfaces. That is, the entire substrate 50 is constituted by a low oxygen concentration region.

Specifically, an oxygen concentration in the substrate 50 is, for example, $5 \times 10^{16}$ cm$^{-3}$ or less, preferably $3 \times 10^{16}$ cm$^{-3}$ or less.

Further, in the present embodiment, the substrate 50 does not include, for example, the polarity reversal domain (inversion domain) as described above.

Curvature of c-Plane and Variation in Off-Angle

Figure 9B:
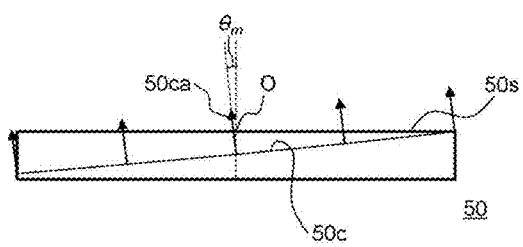
FIG. 9(b) is a schematic cross-sectional view taken along m-axis of the nitride semiconductor substrate according to the first embodiment of the present disclosure.

As illustrated in FIGS. 9(b) and 9(c), in the present embodiment, the c-plane 50c, which is the low index crystal plane closest to the main surface 50s of the substrate 50, is curved in a concave spherical shape with respect to the main surface 50s, due to, for example, the above-described method for manufacturing the substrate 50.

In the present embodiment, the c-plane 50c of the substrate 50 has, for example, a curved surface that approximates to a spherical surface in each of a cross section taken along the m-axis and a cross section taken along the a-axis.

In the present embodiment, since the c-plane 50f of the substrate 50 is curved like a concave spherical surface as described above, at least a part of the c-axis 50ca is inclined with respect to the normal of the main surface 50s. The off-angle θ, which is the angle formed by the c-axis 50ca with respect to the normal of the main surface 50s, has a predetermined distribution within the main surface 50s.

In the off-angle θ formed by the c-axis 50ca with respect to the normal of the main surface 50s, a directional component extending along the m-axis is represented by $\theta_m$, and a directional component extending along the a-axis is represented by $\theta_a$, and $\theta^2 = \theta_m^2 + \theta_a^2$ is satisfied.

In the present embodiment, since the c-plane 50c of the substrate 50 is curved like a concave spherical surface as described above, the off-angle m-axis component $\theta_m$ and the off-angle a-axis component $\theta_a$ can be approximately represented by a linear function of x and a linear function of y, respectively.

In the present embodiment, a radius of curvature of the c-plane 50c of the substrate 50 is larger than, for example, a radius of curvature of the c-plane 10c of the base substrate 10 used in the above-described method for manufacturing the substrate 50.

Specifically, the radius of curvature of the c-plane 50c of the substrate 50 is, for example, 23 m or more, preferably 30 m or more, and more preferably 40 m or more.

For reference, in the case of the c-plane limited growth, the radius of curvature of the c-plane of a substrate that is sliced from a crystal layer having the same thickness as a total thickness of the first layer 30 and the second layer 40 of the present embodiment may be larger than the radius of curvature of the c-plane 10c of the base substrate 10. However, in the case of the c-plane limited growth, when the thickness of the crystal layer is 2 mm, the radius of curvature of the c-plane of the substrate sliced from the crystal layer is about 11 m and is about 1.4 times the radius of curvature of the c-plane 10c of the base substrate 10.

In the present embodiment, an upper limit of the radius of curvature of the c-plane 50c of the substrate 50 is not particularly limited, because the larger, the better. When the c-plane 50c of the substrate 50 is substantially flat, the radius of curvature of the c-plane 50c can be considered infinite.

Further, in the present embodiment, since the radius of curvature of the c-plane 50c of the substrate 50 is large, the variation in the off-angle θ of the c-axis 50ca with respect to the normal of the main surface 50s of the substrate 50 can be smaller than the variation in the off-angle of the c-axis 10ca of the substrate 10.

Specifically, when an X-ray rocking curve of the (0002) plane of the substrate 50 is measured and the off-angle θ of the c-axis 50ca with respect to the normal of the main surface 50s is measured based on a diffraction peak angle of the (0002) plane, variation obtained as a difference between the largest off-angle θ and the smallest off-angle θ within a diameter of 29.6 mm from the center of the main surface 50s is, for example, 0.075° or less, preferably 0.057° or less, and more preferably 0.043° or less.

For reference, in the base substrate 10 prepared by the above-described VAS method, the variation in the off-angle of the c-axis 10ca determined by the above-described measurement method is about 0.22°. Further, in the case of the c-plane limited growth, when a nitride semiconductor substrate is obtained from a crystal layer that has the same thickness (for example, 2 mm) as the total thickness of the first layer 30 and the second layer 40 of the present embodiment, the variation in the off-angle of the c-axis of the nitride semiconductor substrate determined by the above-described measuring method is about 0.15°.

In the present embodiment, a lower limit of the variation in the off-angle θ of the c-axis 50ca of the substrate 50 is not particularly limited, because the smaller, the better. When the c-plane 50c of the substrate 50 is substantially flat, the variation in the off-angle θ of the c-axis 50ca of the substrate 50 can be considered 0°.

Further, in the present embodiment, since the curvature of the c-plane 50c becomes isotropically small with respect to the main surface 50s of the substrate 50, the radius of curvature of the c-plane 50c has little dependence on directions.

Specifically, a difference between a radius of curvature of the c-plane 50c in a direction extending along the a-axis and a radius of curvature of the c-plane 50c in a direction extending along the m-axis determined by the above-described measurement method is, for example, 50% or less, preferably 20% or less of the larger radius of curvature.

Dark Spots

Next, dark spots on the main surface 50s of the substrate 50 of the present embodiment will be described. The "dark spots" referred to herein means points at which the light emission intensity is low in an observation image of the main surface 50s observed using a multiphoton excitation microscope a cathode luminescence image of the main surface 50s, or the like, and includes not only dislocations but also non-light-emissive centers due to foreign matters or point defects. The "multiphoton excitation microscope" is sometimes referred to as a two-photon excitation fluorescence microscope.

In the present embodiment, since the substrate 50 is manufactured using the base substrate 10 constituted by a high-purity GaN single crystal prepared by the VAS method, there are few non-light-emissive centers due to foreign matters or point defects in the substrate 50. Accordingly, when the main surface of the substrate 50 is observed using a multiphoton excitation microscope or the like, 95% or more, preferably 99% or more of the dark spots are dislocations rather than non-light-emissive centers due to foreign matters or point defects.

Further, in the present embodiment, by the above-described manufacturing method, the dislocation density in the surface of the second layer 40 is lower than the dislocation density in the main surface 10s of the base substrate 10. Thereby, dislocations are also reduced in the main surface 50s of the substrate 50 formed by slicing the second layer 40.

Further, in the present embodiment, since three-dimensional growth of the first layer 30 is promoted due to the growth inhibition portions 20a that are randomly scattered over the main surface 10s of the base substrate 10 by the above-described manufacturing method, regions that have high dislocation density due to concentration of dislocations are not formed, and regions having low dislocation density are uniformly formed in the main surface 50s of the substrate 50 formed by slicing the second layer 40.

Specifically, in the present embodiment, when a dislocation density is determined from a dark spot density by observing the main surface 50s of the substrate 50 using the multiphoton excitation microscope in a field of view of 250 μm square, there is no region that has a dislocation density higher than $3 \times 10^6$ cm$^{-2}$, and regions having a dislocation density lower than $1 \times 10^6$ cm$^{-2}$ constitute 70% or more, preferably 80% or more, and more preferably 90% or more of the main surface 50s.

In other words, in the present embodiment, a dislocation density determined by averaging the entire main surface 50s of the substrate 50 is, for example, less than $1 \times 10^6$ cm$^{-2}$, preferably less than $7.0 \times 10^5$ cm$^{-2}$, and more preferably $5 \times 10^5$ cm$^{-2}$ or less.

In the case where the manufacturing method of the present embodiment is used, an upper limit of the ratio of regions that have a dislocation density lower than $1 \times 10^6$ cm$^{-2}$ is, for example, 99% of the main surface 50s.

Further, the main surface 50s of the substrate 50 of the present embodiment includes, for example, dislocation-free regions of at least 25 μm square, preferably at least 50 μm square, for example, based on the average distance L between closest peaks in the first step S200 described above. Further, 50 μm square dislocation-free regions are scattered over the entire main surface 50s of the substrate 50, for example.

Further, the main surface 50s of the substrate 50 of the present embodiment includes, for example, 25 μm square dislocation-free regions that do not overlap each other at a density of 100 regions/cm$^2$ or more, preferably 800 regions/cm$^2$ or more, and more preferably 1600 regions/cm$^2$ or more. The case where the density of 25 μm square dislocation-free regions that do not overlap each other is 1600 regions/cm$^2$ or more corresponds to, for example, a case where the main surface 50s includes at least one 25 μm square dislocation-free region in an arbitrary field of view of 250 μm square. An upper limit of the density of 25 μm square dislocation-free regions that do not overlap each other is 40,000 regions/cm$^2$ due to the measurement method.

Further, the main surface 50s preferably includes, for example, 50 μm square dislocation-free regions that do not overlap each other at a density of 100 regions/cm$^2$ or more, preferably 800 regions/cm$^2$ or more, and more preferably 1,600 regions/cm$^2$ or more.

For reference, in the case of a substrate that is obtained by a conventional manufacturing method in which a special process for collecting dislocations is not performed, the size of dislocation-free regions is smaller than 25 μm square, or the density of 25 μm square dislocation-free regions is lower than 100 regions/cm$^2$.

Next, the Burgers vector of the dislocations in the substrate 50 of the present embodiment will be described.

In the present embodiment, since the dislocation density in the main surface 10s of the base substrate 10 used in the above-described manufacturing method is low, a plurality of dislocations are unlikely to be combined (mixed) when the first layer 30 and the second layer 40 are grown on the base substrate 10. This makes it possible to suppress the formation of dislocations having a large Burgers vector in the substrate 50 obtained from the second layer 40.

Specifically, in the substrate 50 of the present embodiment, there are many dislocations whose Burgers vector is either <11-20>/3, <0001>, or <11-23>/3. The "Burgers vector" referred to herein can be measured by, for example, a large-angle convergent-beam electron diffraction method (LACBED method) using a transmission electron microscope (TEM). Further, dislocations whose Burgers vector is <11-20>/3 are edge dislocations, dislocations whose Burgers vector is <0001> are screw dislocations, and dislocations whose Burgers vector is <11-23>/3 are mixed dislocations in which edge dislocations and screw dislocations are mixed.

In the present embodiment, when 100 dislocations on the main surface 50s of the substrate 50 are extracted at random, a percentage of dislocations whose Burgers vector is either <11-20>/3, <0001>, or <11-23>/3, is, for example, 50% or more, preferably 70% or more, and more preferably 90% or more. Dislocations whose Burgers vector is 2<11-20>/3, <11-20>, or the like may be present in at least a part of the main surface 50s of the substrate 50.

X-Ray Rocking Curve Measurement Performed by Varying Slit Width

Here, the inventor found that by measuring the X-ray rocking curve while varying the width of an incident side slit, both crystal quality factors of the substrate 50 of the present embodiment and the curvature (warp) of the c-plane 50c described above can be evaluated at the same time.

First, the influence of crystal quality factors on the X-ray rocking curve measurement will be described.

A full width at half maximum of a diffraction pattern in the X-ray rocking curve measurement is greatly affected by crystal quality factors such as high/low dislocation density, high/low mosaicity, high/low stacking fault density, high/low basal plane dislocation density, high/low point defect density (vacancy, etc.), large or small amount of in-plane fluctuation of lattice constant, and a distribution of an impurity concentration. When these crystal quality factors are not good, a fluctuation of a diffraction angle in the X-ray rocking curve measurement becomes large, and the full width at half maximum of the diffraction pattern becomes large.

Figure 10A:
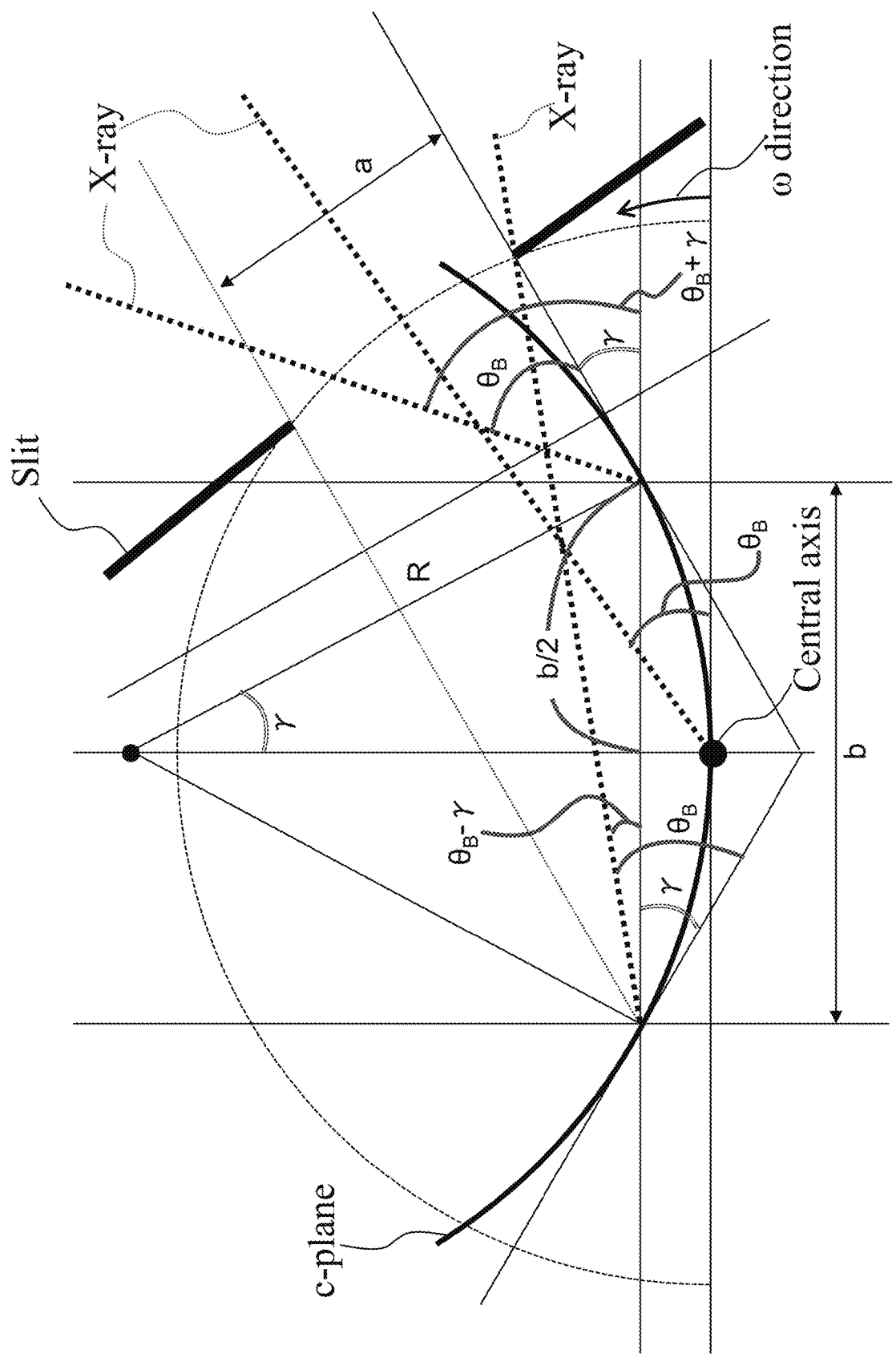
FIG. 10(a) is a schematic cross-sectional view illustrating X-ray diffraction with respect to a curved c-plane.

Next, the influence of the curvature of the c-plane 50c in the X-ray rocking curve measurement will be described with reference to FIG. 10(a). FIG. 10(a) is a schematic cross-sectional view illustrating diffraction of X-rays with respect to the curved c-plane.

An X-ray irradiation width b on the main surface of the substrate is calculated by the following formula (h), $$b = a/\sin\theta_B \quad (h)$$

wherein a represents the width of an X-ray incident side slit, b represents the X-ray irradiation width (footprint) by which the main surface of the substrate is irradiated with X-rays, and θB represents the Bragg angle of the crystal.

In a case where the c-plane of the substrate is curved, the radius of curvature R of the c-plane is very large relative to the X-ray irradiation width b as illustrated in FIG. 10(a) in which R represents the radius of curvature of the c-plane and Y represents half of the central angle formed by the curved c-plane within the range of the X-ray irradiation width b. Therefore, the angle γ can be calculated by the following formula (i).

$$\gamma = \sin^{-1}(b/2R) \approx b/2R \quad (i)$$

At this time, at the incident side end (right end in the figure) of the region on the c-plane of the substrate irradiated with X-rays, the diffraction angle with respect to the main surface of the substrate is $\theta_B + \gamma = \theta_B + b/2R$.

On the other hand, at the light receiving side end (left end in the figure) of the region on the c-plane of the substrate irradiated with X-rays, the diffraction angle with respect to the main surface of the substrate is $\theta_B - \gamma = \theta_B - b/2R$.

Accordingly, based on the difference between the diffraction angle with respect to the main surface of the substrate at the incident side end of the c-plane of the substrate and the diffraction angle with respect to the main surface of the substrate at the light receiving side end of the c-plane of the substrate, the fluctuation of the X-ray diffraction angle with respect to the curved c-plane is b/R.

Figure 10B:
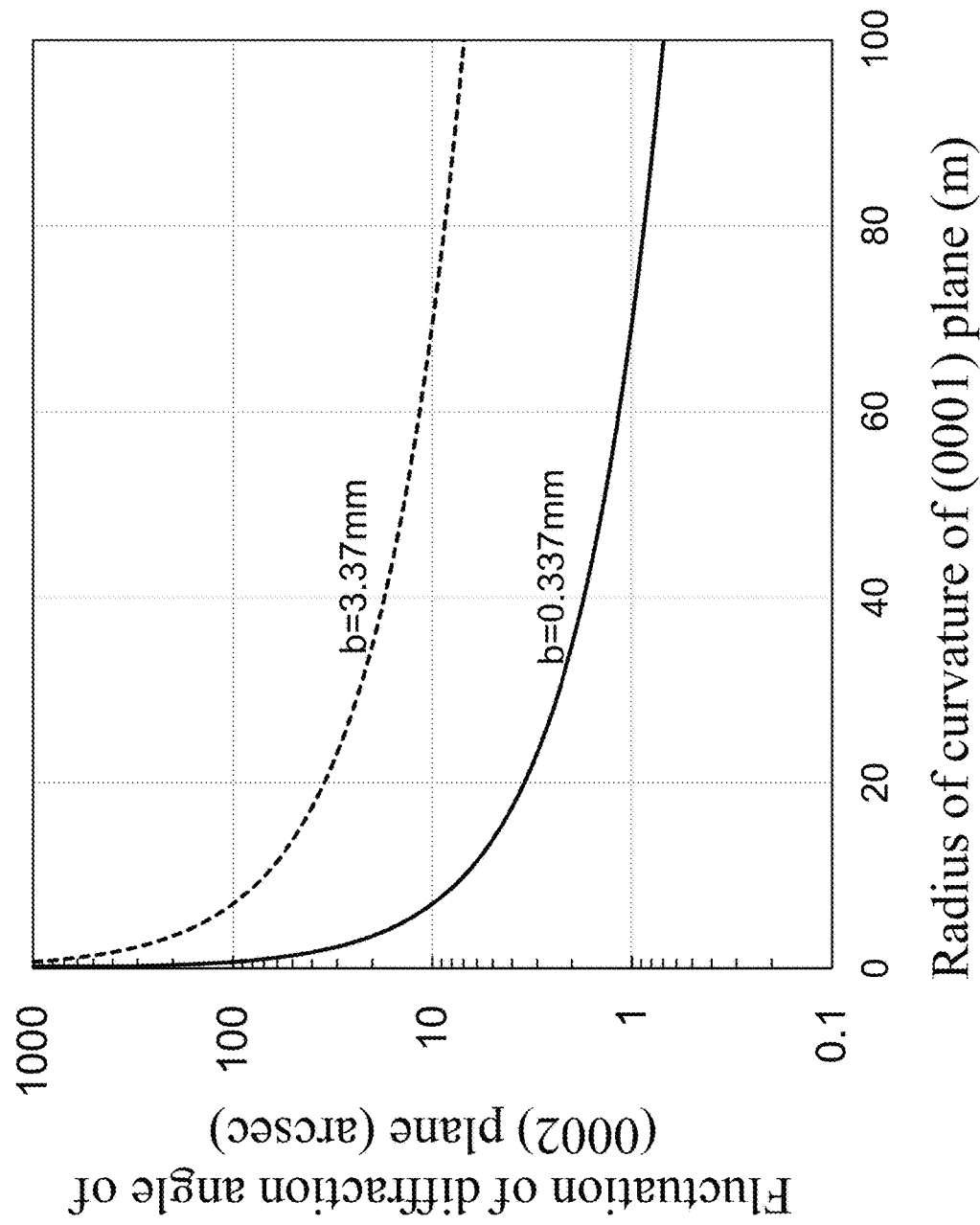
FIGS. 10(b) and 10(c) are views illustrating fluctuation of a diffraction angle of a (0002) plane with respect to a radius of curvature of the c-plane.
Figure 10C:
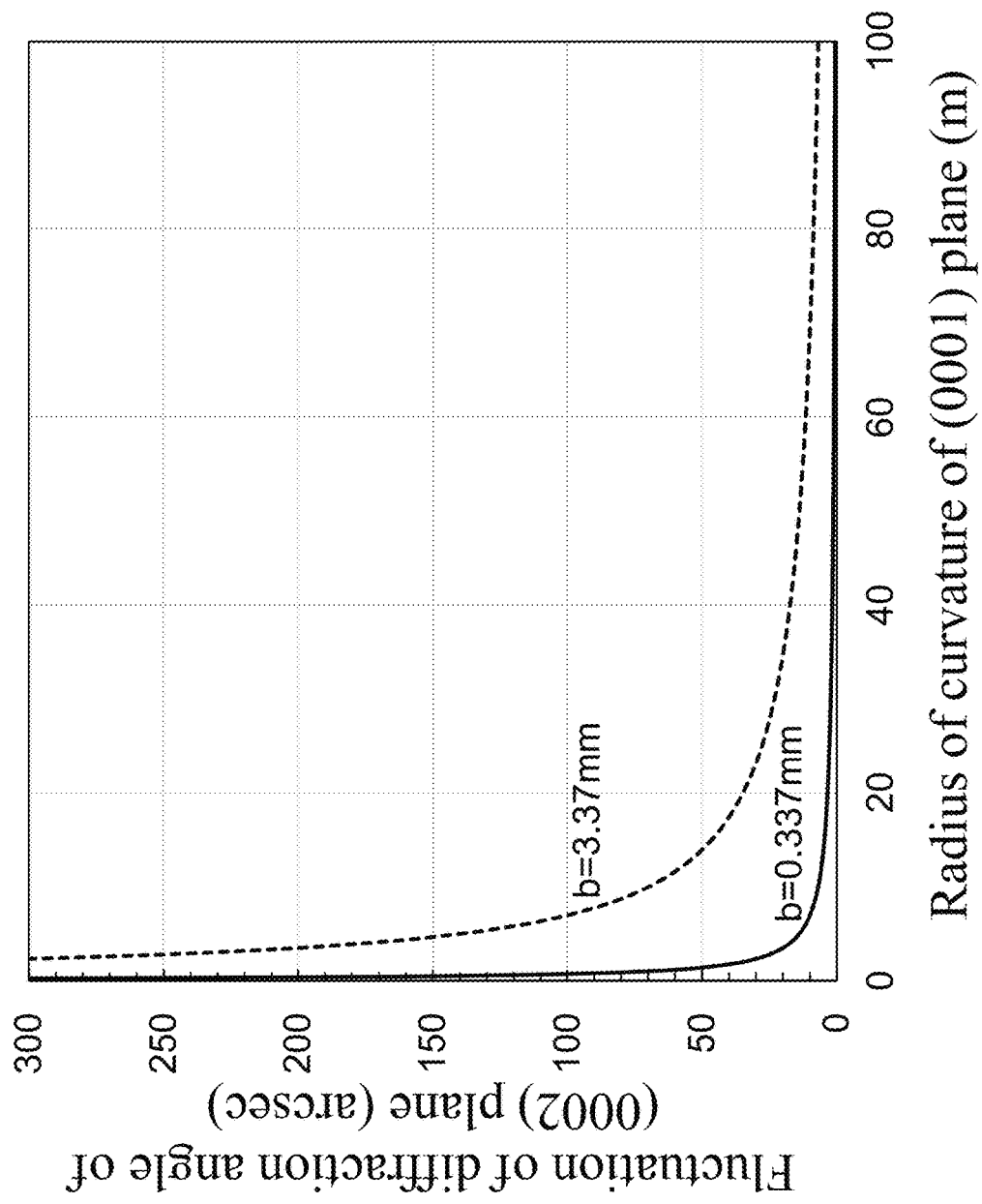

FIGS. 10(b) and 10(c) are diagrams illustrating the fluctuation of the diffraction angle of the (0002) plane relative to the radius of curvature of the c-plane. The vertical axis of FIG. 10(b) is a logarithmic scale, and the vertical axis of FIG. 10(c) is a linear scale.

As illustrated in FIGS. 10(b) and 10(c), when the width a of the X-ray incident side slit is increased, that is, when the X-ray irradiation width b is increased, fluctuation of the diffraction angle of the (0002) plane increases according to the X-ray irradiation width b. Also, as the radius of curvature R of the c-plane becomes smaller, the fluctuation of the diffraction angle of the (0002) plane gradually increases. The difference in the fluctuation of the diffraction angle of the (0002) plane between different X-ray irradiation widths b becomes larger as the radius of curvature R of the c-plane becomes smaller.

When the width a of the incident side slit is narrow, the influence of the curvature of the c-plane is small, and the influence of the above-described crystal quality factors becomes dominant in the fluctuation of the diffraction angle of the (0002) plane. However, when the width a of the incident side slit is wide, both the influence of the above-described crystal quality factors and the influence of the curvature of the c-plane are superimposed in the fluctuation of the diffraction angle of the (0002) plane. Accordingly, when the X-ray rocking curve measurement is performed while varying the width a of the incident side slit, both the above-described crystal quality factors and the curvature (warp) of the c-plane can be evaluated at the same time over the region irradiated with X-rays.

Here, features of the substrate 50 of the present embodiment when the X-ray rocking curve is measured will be described.

In the following, when an X-ray rocking curve of (0002) plane diffraction is measured by irradiating the main surface 50s of the substrate 50 with Cu Kα1 X-rays via a two-crystal monochromator of a Ge (220) plane and a slit, a full width at half maximum of the (0002) plane diffraction when the width of the slit in a ω direction is 1 mm is represented by "FWHMa", and a full width at half maximum of the (0002) plane diffraction when the width of the slit in the ω direction is 0.1 mm is represented by "FWHMb". The "ω direction" refers to a rotation direction when the substrate 50 is rotated about an axis that is parallel to the main surface of the substrate 50 and passes through the center of the substrate 50 in the X-ray rocking curve measurement.

In the substrate 50 of the present embodiment, all of the crystal quality factors such as high/low dislocation density, high/low mosaicity, high/low stacking fault density, high/low basal plane dislocation density, high/low point defect density (vacancy, etc.), large or small amount of in-plane fluctuation of lattice constant, and a distribution of an impurity concentration are good.

As a result, in the substrate 50 of the present embodiment, when the X-ray rocking curve measurement of the (0002) plane diffraction is performed by setting the width of the slit in the ω direction to 0.1 mm, the full width at half maximum FWHMb of the (0002) plane diffraction is, for example, 80 arcsec or less, preferably 50 arcsec or less, and more preferably 38.5 arcsec or less.

Further, in the substrate 50 of the present embodiment, all of the above-described crystal quality factors are good over a wide range of the main surface 50s.

As a result, when the X-ray rocking curve measurement of the (0002) plane diffraction is performed at a plurality of measurement points that are set at 5 mm intervals (between the center and the outer edge) within the main surface 50s of the substrate 50 of the present embodiment by setting the width of the slit in the ω direction to 0.1 mm, the full width at half maximum FWHMb of the (0002) plane diffraction is 80 arcsec or less, preferably 50 arcsec or less, and more preferably 38.5 arcsec or less, for example, at 90% or more of all the measurement points.

Further, in the substrate 50 of the present embodiment, in-plane variation of the above-described crystal quality factors is small. Therefore, a (0002) plane diffraction pattern obtained in the X-ray rocking curve measurement performed by setting the width of the incident side slit wide is unlikely to be narrower than a (0002) plane diffraction pattern obtained in the X-ray rocking curve measurement performed by setting the width of the incident side slit narrow.

As a result, in the substrate 50 of the present embodiment, the full width at half maximum FWHMa of the (0002) plane diffraction when the width of the slit in the ω direction is 1 mm can be, for example, larger than or equal to the full width at half maximum FWHMb of the (0002) plane diffraction when the width of the slit in the ω direction is 0.1 mm.

Even when the crystal quality factors of the substrate 50 are good, there is a case where FWHMa<FWHMb, with FWHMb being very small.

Further, in the substrate 50 of the present embodiment, as described above, not only there are few dislocations, but also all of the above-described crystal quality factors are good in a well-balanced manner over a wide range of the main surface 50s. Further, the curvature of the c-plane 50c of the substrate 50 is small, and the radius of curvature of the c-plane 50c is large. Due to the above-described crystal quality factors being good in a well-balanced manner across the region irradiated with X-rays and the radius of curvature of the c-plane being large in the substrate 50 of the present embodiment, fluctuation of the diffraction angle of the (0002) plane does not become large even when the X-ray rocking curve measurement is performed by setting the width of the incident side slit wide. Therefore, even when the X-ray rocking curve measurement is performed by varying the width of the incident side slit, a difference in the fluctuation of the diffraction angle of the (0002) plane is small.

As a result, at a predetermined measurement point (e.g., the center of the main surface) of the substrate 50 of the present embodiment, a difference FWHMa-FWHMb obtained by subtracting the full width at half maximum FWHMb of the (0002) plane diffraction when the width of the slit in the ω direction is 0.1 mm from the full width at half maximum FWHMa of the (0002) plane diffraction when the width of the slit in the ω direction is 1 mm is, for example, (0% or more and) 30% or less, preferably 22% or less of FWHMa.

Further, when the X-ray rocking curve measurement of the (0002) plane diffraction is performed at a plurality of measurement points set at 5 mm intervals (between the center and the outer edge) within the main surface 50s of the substrate 50 of the present embodiment by varying the width of the slit in the ω direction, FWHMa-FWHMb is, for example, 30% or less, preferably 22% or less of FWHMa, at 95% or more, preferably 100% of all the measurement points.

In the substrate 50 of the present embodiment, even when FWHMa<FWHMb, |FWHMa−FWHMb|/FWHMa is 30% or less.

Further, in the substrate 50 of the present embodiment, even when the X-ray rocking curve measurement is performed by setting the width of the incident side slit wide, variation of the above-described crystal quality factors is small across the region irradiated with X-rays, and therefore, the diffraction pattern has a single peak.

For reference, a substrate manufactured by a conventional manufacturing method (hereinafter, also referred to as a conventional substrate) will be described. The conventional manufacturing method referred to herein is, for example, a conventional VAS method, a method of growing a thick film using the c-plane as a growth surface, the above-described DEEP method, a THVPE (Tri-halide vapor phase epitaxy) method, an ammonothermal method, or a flux method.

In the conventional substrate, at least any of the above-described crystal quality factors is not good when compared with that of the substrate 50 of the present embodiment. Therefore, FWHMb in the conventional substrate is larger than that of the substrate 50 of the present embodiment.

In the conventional substrate, in-plane variation of at least any of the above-described crystal quality factors may occur. Therefore, a (0002) plane diffraction pattern obtained in the X-ray rocking curve measurement performed by setting the width of the incident side slit wide may be wider than a (0002) plane diffraction pattern obtained in the X-ray rocking curve measurement performed by setting the width of the incident side slit narrow. As a result, in the conventional substrate, FWHMa<FWHMb may be satisfied.

In the conventional substrate, the radius of curvature of the c-plane is smaller than that of the substrate 50 of the present embodiment. When the width of the slit is wide, at least a part of the region irradiated with X-rays necessarily includes a portion where at least any of the crystal quality factors is not good when compared with that of the substrate 50 of the present embodiment. Therefore, the difference FWHMa−FWHMb in the base substrate 10 becomes larger than that of the substrate 50 of the present embodiment.

In the conventional substrate, in-plane variation of at least any of the above-described crystal quality factors may occur. When the width of the slit is wide, fluctuation of the diffraction angle may vary in at least a part of the region irradiated with X-rays. Therefore, the diffraction pattern may have a plurality of peaks when the width of the slit is wide.

As described above, the conventional substrate may not satisfy the above-described conditions defined for the substrate 50 of the present embodiment.

(4) Effects Achieved by the Present Embodiment

According to the present embodiment, one or more of the following effects can be achieved.
  (a) By forming the growth inhibition layer 20 including the growth inhibition portions 20a randomly scattered over the entire main surface 10s of the base substrate 10 in the growth inhibition layer forming step S190, three-dimensional growth of the first layer 30 can be promoted in the first step S200 due to the growth inhibition layer 20 to generate inclined interfaces 30i other than the c-plane at the surface of the single crystal constituting the first layer 30. By generating the inclined interfaces 30i other than the c-plane as described above, it is possible to bend dislocations and make the dislocations propagate in a direction that is substantially perpendicular to the inclined interfaces 30i at positions where the inclined interfaces 30i are exposed. Thus, the dislocations can be locally collected. As a result of the dislocations being locally collected, dislocations that have Burgers vectors opposite to each other disappear. Alternatively, as a result of the locally collected dislocations forming a loop, the dislocations can be kept from propagating to the surface side of the second layer 40. Thus, the dislocation density in the surface of the second layer 40 can be lowered. As a result, a substrate 50 having a lower dislocation density than the base substrate 10 can be obtained.
  (b) As described above, since some of the plurality of dislocations disappear and some of the plurality of dislocations are kept from propagating to the surface side of the second layer 40 during the growth process of the second layer 40, the dislocation density can be lowered sharply and faster than in the case of the c-plane limited growth. That is, the dislocation density reduction rate $N/N_0$ in the present embodiment can be made smaller than the dislocation density reduction rate $N'/N_0$ of the case of the c-plane limited growth. As a result, the substrate 50 having a lower dislocation density than the base substrate 10 can be efficiently obtained, and its productivity can be improved.
  (c) In the first step S200, the c-plane 30c disappears from the top surface 30u of the first layer 30 due to the growth inhibition layer 20. Thereby, a plurality of valleys 30v and a plurality of peaks 30t can be formed in the surface of the first layer 30. As a result, the dislocations propagated from the base substrate 10 can be reliably bent at positions where the inclined interfaces 30i in the first layer 30 are exposed.

Here, a case where the c-plane remains in the first step will be considered. In this case, in portions where the c-plane remains, the dislocations propagated from the base substrate propagate substantially vertically upward without being bent and reach the surface of the second layer. Therefore, the dislocations are not reduced and high dislocation density regions are formed above the portions where the c-plane remains.

In contrast, according to the present embodiment, since the c-plane 30c disappears from the top surface 30u of the first layer 30 due to the growth inhibition layer 20 in the first step S200, the surface of the first layer 30 can be constituted only by the inclined interfaces 30i other than the c-plane, and the plurality of valleys 30v and the plurality of peaks 30t can be formed in the surface of the first layer 30. Thereby, the dislocations propagated from the base substrate 10 can be reliably bent over the entire surface of the first layer 30. Since the dislocations are reliably bent, some of the plurality of dislocations are likely to disappear, or some of the plurality of dislocations are unlikely to propagate to the surface side of the second layer 40. As a result, the dislocation density can be lowered over the entire main surface 1s of the substrate 50 obtained from the second layer 40.
  (d) In the present embodiment, spontaneous three-dimensional growth of the first layer 30 is promoted due to the growth inhibition layer 20, and therefore, the first growth condition can satisfy the formula (1) even if the range of the first growth condition is increased. Specifically, the first growth condition, which is the growth temperature in the first step S200, the V/III ratio in the first step S200, or the like can be made substantially equal to the second growth condition in the second step S300. When the first growth condition is substantially equal to the second growth condition, a series of manufacturing steps can be carried out with ease. Also, the manufacturing steps can be shortened since the growth temperature and the V/III ratio need not be adjusted.

(e) In the present embodiment, since the first growth condition satisfies the formula (1) due to the growth inhibition layer 20, {11-2m} planes satisfying m≥3 can be generated as the inclined interfaces 30i in the first step S200. Thereby, an inclination angle of the {11-2m} plane with respect to the c-plane 30c can be made moderate. Specifically, the inclination angle can be 47.3° or less. Since the inclination angle of the {11-2m} plane with respect to the c-plane 30c is moderate, a cycle of the plurality of peaks 30t can be lengthened. Specifically, the average distance L between closest peaks can be greater than 100 µm when an arbitrary cross section perpendicular to the main surface 10s of the base substrate 10 is observed.

For reference, when an etch pit is generated in a nitride semiconductor substrate using a predetermined etchant, an etch pit that is constituted by a {1-10n} plane is usually formed in the surface of the substrate. In contrast, {11-2m} planes satisfying m≥3 can be generated in the surface of the first layer 30 grown under a predetermined condition in the present embodiment. Accordingly, it is considered that the inclined interfaces 30i peculiar to the manufacturing method are formed in the present embodiment as compared with the usual etch pit.

(f) In the present embodiment, when an arbitrary cross section perpendicular to the main surface 10s of the base substrate 10 is observed, the average distance L between closest peaks is greater than 50 µm due to the growth inhibition layer 20, and therefore, at least a distance longer than 25 µm can be secured for the dislocations to bend and propagate. Thereby, the dislocations can be sufficiently collected above substantially the center between each pair of peaks 30t of the first layer 30. As a result, the dislocation density in the surface of the second layer 40 can be sufficiently lowered.

(g) In the first step S200, after the c-plane 30c disappears from the surface of the first layer 30 due to the growth inhibition layer 20, the growth of the first layer 30 is continued over a predetermined thickness while a state where the surface is constituted only by the inclined interfaces 30i is maintained due to the growth inhibition layer 20. Thereby, it is possible to make sure that the c-plane 30c disappears over the entire surface of the first layer 30. For example, even if the timing at which the c-plane 30c disappears from the surface of the first layer 30 in the inclined interface expansion step S220 shifts and the c-plane 30c partially remains in the expanded inclined interface layer 32, it is possible to make sure that the c-plane 30c disappears.

Further, a sufficient time can be secured to bend the dislocations at positions where the inclined interfaces 30i are exposed, by continuing the growth of the first layer 30 at the inclined interfaces 30i after the c-plane 30c disappears. Here, if the c-plane is grown immediately after disappearing, there is a possibility that the dislocations are not sufficiently bent and propagate in the substantially vertical direction toward the surface of the second layer. In contrast, according to the present embodiment, since sufficient time is secured to bend the dislocations at positions where the inclined interfaces 30i other than the c-plane are exposed, particularly, dislocations near the peaks 30t of the first layer 30 can be reliably bent, and the dislocations can be kept from propagating in the substantially vertical direction from the base substrate 10 toward the surface of the second layer 40. Thereby, concentration of the dislocations above the peaks 30t of the first layer 30 can be suppressed.

(h) In the growth inhibition layer forming step S190, in situ formation of the growth inhibition layer 20 is performed on the main surface 10s of the base substrate 10 in a predetermined vapor phase growth apparatus. After the in situ formation of the growth inhibition layer 20, the first step S200 and the second step S300 are successively performed using the vapor phase growth apparatus. That is, the growth inhibition layer forming step S190, the first step S200, and the second step S300 are continuously performed in the same vapor phase growth apparatus without exposing the base substrate 10 to the atmosphere. Thus, it is possible to suppress unintended formation of a high oxygen concentration region at the interface between the main surface 10s of the base substrate 10 exposed in the openings 20b of the growth inhibition layer 20 and the first layer 30 and at the interface between the first layer 30 and the second layer 40.

Further, since the in situ formation of the growth inhibition layer 20 is performed in the vapor phase growth apparatus so as to randomly scatter the growth inhibition portions 20a over the entire main surface 10s of the base substrate 10, a photolithography step for forming the growth inhibition layer 20 can be omitted. Thus, manufacturing steps can be shortened and the manufacturing cost can be reduced.

(i) According to the manufacturing method of the present embodiment, the radius of curvature of the c-plane 50c of the substrate 50 can be made larger than the radius of curvature of the c-plane 10c of the base substrate 10. Thereby, the variation in the off-angle θ of the c-axis 50ca with respect to the normal of the main surface 50s of the substrate 50 can be made smaller than the variation in the off-angle of the c-axis 10ca of the base substrate 10.

For example, the following reasons are conceivable as reasons why the radius of curvature of the c-plane 50c of the substrate 50 can be made large.

As described above, in the first step S200, the inclined interface growth region 70 is formed by three-dimensionally growing the first layer 30 with the inclined interfaces 30i other than the c-plane as growth surfaces. In the inclined interface growth region 70, oxygen is easily taken in as compared with the first c-plane growth region 60. Therefore, the oxygen concentration in the inclined interface growth region 70 is higher than the oxygen concentration in the first c-plane growth region 60. That is, the inclined interface growth region 70 can be considered as being a high oxygen concentration region.

By taking oxygen into the high oxygen concentration region as described above, the lattice constant of the high oxygen concentration region can be made larger than the lattice constant of regions other than the high oxygen concentration region (reference: Chris G. Van de Walle, Physical Review B vol. 68, 165209 (2003)). Due to the curvature of the c-plane 10c of the base substrate 10, a stress that is concentrated toward the center of curvature of the c-plane is applied on the base substrate 10 or the first c-plane growth region 60 grown with the c-plane 30c of the first layer 30 as a growth surface. In contrast, by making the lattice constant in the high oxygen concentration region relatively large, a stress can be generated in the high oxygen concentration region so as to spread the c-plane 30c outward in a direction extending along the surface. Thereby, the stress concentrated toward the center of curvature of the c-plane 30c on the lower side of the high oxygen concentration region can be offset by the stress that causes the c-plane 30c in the high oxygen concentration region to spread outward in the direction extending along the surface.

Due to the stress offset effect of the first layer 30 described above, the radius of curvature of the c-plane 50c of the substrate 50 obtained from the second layer 40 can be made larger than the radius of curvature of the c-plane 10c of the base substrate 10 obtained by the conventional VAS method.

(j) In the substrate 50 obtained by the manufacturing method of the present embodiment, not only the dislocation density can be lowered and the variation in the off-angle can be reduced, but also all of the above-described crystal quality factors that determine the full width at half maximum in the X-ray rocking curve measurement can be made good in a well-balanced manner. Thereby, in the substrate 50 of the present embodiment, FWHMb can be 38.5 arcsec or less. Further, in the substrate 50 of the present embodiment, the radius of curvature of the c-plane is large and the above-described crystal quality factors are good in a well-balanced manner over the entire region irradiated with X-rays even when the slit width is 1 mm, and therefore, (FWHMa-FWHMb)/FWHMa can be 30% or less.

Second Embodiment of the Present Disclosure

Next, a second embodiment of the present disclosure will be described.

In the first embodiment described above, the first step S200 is performed after the predetermined growth inhibition layer 20 is formed in the growth inhibition layer forming step S190. In this case, even if the amount of $SiH_2Cl_2$ gas supplied in the growth inhibition layer forming step S190 is adjusted, many growth inhibition portions 20a are likely to be formed, and the coverage rate of the growth inhibition portions 20a with respect to the main surface 10s of the base substrate 10 may be high. Therefore, the average distance L between closest peaks of the expanded inclined interface layer 32 may be short in the inclined interface expansion step S220. If the average distance L between closest peaks is short, there is a possibility of the distance by which dislocations bend and propagate becoming short and the dislocations not being sufficiently collected in the steps after the inclined interface expansion step S220.

Therefore, the method for forming the growth inhibition layer 20 may be changed as in the present embodiment described below. In the present embodiment, the timing of the growth inhibition layer forming step S190 differs from that in the first embodiment described above.

The following describes only elements that differ from those in the above embodiment, and elements that are substantially the same as those described in the above embodiment are denoted with the same reference signs as those used in the above embodiment, and descriptions of which are omitted.

(1) Method for Manufacturing a Nitride Semiconductor Substrate
(Steps S190 and S200)

In the present embodiment, for example, the first step S200 is performed while the growth inhibition layer forming step S190 is performed.

That is, in the present embodiment, the state illustrated in FIG. 3(b) is skipped, and three-dimensional growth of the first layer 30 is started while the growth inhibition layer 20 is formed as illustrated in FIG. 3(c).

Specifically, for example, the base substrate 10 is heated up to the growth temperature in the first step S200 in the vapor phase growth apparatus, and a large amount of $SiH_2Cl_2$ gas is supplied to the heated base substrate 10 while GaCl gas and $NH_3$ gas are supplied to the base substrate 10. Thus, a GaN layer can be three-dimensionally grown as the first layer 30 on the main surface 10s due to the growth inhibition layer 20 while a SiN layer is formed as the growth inhibition layer 20.

At this time, the $SiH_2Cl_2$ gas is supplied in a larger amount than a case of forming a usual n-type semiconductor layer, for example. Specifically, the ratio (hereinafter also referred to as a "Si/Ga partial pressure ratio") of a partial pressure of the $SiH_2Cl_2$ gas to a partial pressure of the GaCl gas is, for example, $1\times10^{-4}$ or more and $6\times10^{-4}$ or less. If the Si/Ga partial pressure ratio is less than 1×104, the GaN layer, which is the first layer 30, is formed over the entire main surface 10s of the base substrate 10. That is, the growth inhibition layer 20 is not sufficiently formed. In contrast, in the present embodiment, the Si/Ga partial pressure ratio is $1\times10^{-4}$ or more, and therefore, the predetermined growth inhibition layer 20 can be sufficiently formed on the main surface 10s of the base substrate 10, and three-dimensional growth of the first layer 30 can be promoted due to the growth inhibition layer 20. On the other hand, if the Si/Ga partial pressure ratio is greater than $6\times10^{-4}$, the coverage rate of the growth inhibition portions 20a with respect to the main surface 10s of the base substrate 10 may be excessively high. As a result, growth of the first layer 30 may be hindered over the entire main surface 10s of the base substrate 10. In contrast, in the present embodiment, the Si/Ga partial pressure ratio is $6\times10^{-4}$ or less, and therefore, the growth inhibition portions 20a can be scattered over the entire main surface 10s of the base substrate 10, and an excessive increase in the coverage rate of the growth inhibition portions 20a with respect to the main surface 10s of the base substrate 10 can be suppressed. Thereby, desired openings 20b can be formed in the growth inhibition layer 20, and the first layer 30 can be three-dimensionally grown on the main surface 10s of the base substrate 10 via the openings 20b of the growth inhibition layer 20.

Growth conditions other than the Si/Ga partial pressure ratio in the present embodiment can be adjusted as appropriate so long as the above-described first growth condition is satisfied.

Further, in the present embodiment, for example, a large amount of $SiH_2Cl_2$ gas is supplied at least for a predetermined period from the start of the inclined interface expansion step S220 in the first step S200 while the GaCl gas and the $NH_3$ gas are supplied. Thereby, the predetermined growth inhibition layer 20 can be formed on the main surface 10s of the base substrate 10 before the GaN layer is formed as the first layer 30 over the entire main surface 10s of the base substrate 10. The supply of the $SiH_2Cl_2$ gas may be stopped after the predetermined period has elapsed from the start of the inclined interface expansion step S220.

On the other hand, it is also possible to supply a large amount of $SiH_2Cl_2$ gas from the start to the end of the inclined interface expansion step S220 (i.e., until the c-plane 30c disappears) while the GaCl gas and the $NH_3$ gas are supplied. It is also possible to supply a large amount of $SiH_2Cl_2$ gas from the start of the inclined interface expansion step S220 to at least midway of the inclined interface maintenance step S240. Further, it is also possible to supply a large amount of SiH$_2$Cl$_2$ gas from the start of the inclined interface expansion step S220 to the end of the inclined interface maintenance step S240.

The average distance L between closest peaks of the expanded inclined interface layer 32 can be easily adjusted by adjusting the above-described Si/Ga partial pressure ratio and the period (timing) of supplying the SiH$_2$Cl$_2$ gas. For example, the average distance L between closest peaks of the expanded inclined interface layer 32 in the present embodiment can be made longer than that in the above embodiment.

Specifically, the average distance L between closest peaks of the expanded inclined interface layer 32 can be, for example, greater than 100 µm. Thereby, it is possible to secure at least a distance longer than 50 µm for the dislocations to bend and propagate in the steps after the inclined interface expansion step S220. As a result, the dislocation density in the surface of the second layer 40 can be more reliably lowered. In the present embodiment as well, the average distance L between closest peaks of the expanded inclined interface layer 32 is preferably less than 800 µm, for example.

Steps after the first step S200 are the same as those in the above embodiment.

(2) Effects Achieved by the Present Embodiment

In the present embodiment, three-dimensional growth of the first layer 30 can be started while the growth inhibition layer 20 is formed by performing the first step S200 while performing the growth inhibition layer forming step S190. Since the timing of the formation of the growth inhibition layer 20 overlaps the timing of the three-dimensional growth of the first layer 30, it is possible to suppress excessive formation of the growth inhibition portions 20a and suppress an excessive increase in the coverage rate of the growth inhibition portions 20a with respect to the main surface 10s of the base substrate 10. Thereby, the average distance L between closest peaks of the expanded inclined interface layer 32 can be easily adjusted in the inclined interface expansion step S220.

In the present embodiment, the average distance L between closest peaks of the expanded inclined interface layer 32 can be easily increased to greater than 100 µm, for example. Thereby, the dislocation density in the surface of the second layer 40 can be more reliably lowered.

Other Embodiments

Embodiments of the present disclosure have been described. However, the present disclosure is not limited to the above-described embodiments, and various modifications can be made without departing from the gist thereof.

In the above-described embodiments, an explanation is given for the case where the base substrate 10 is a GaN free-standing substrate, but the base substrate 10 is not limited to the GaN free-standing substrate, and for example, may be a free-standing substrate constituted by a group III nitride semiconductor such as aluminum nitride (AlN), aluminum gallium nitride (AlGaN), indium nitride (InN), indium gallium nitride (InGaN), or aluminum indium gallium nitride (AlInGaN), that is, a free-standing substrate constituted by a group III nitride semiconductor represented by a composition formula of Al$_x$In$_y$Ga$_{1-x-y}$N (0≤x≤1, 0≤y≤1, 0≤x+y≤1).

In the above-described embodiments, an explanation is given for the case where the substrate 50 is a GaN free-standing substrate, but the substrate 50 is not limited to the GaN free-standing substrate, and for example, may be a free-standing substrate constituted by a group III nitride semiconductor such as AlN, AlGaN, InN, InGaN, or AlInGaN, that is, a free-standing substrate constituted by a group III nitride semiconductor represented by a composition formula of Al$_x$In$_y$Ga$_{1-x-y}$N (0≤x≤1, 0≤y≤1, 0≤x+y≤1).

In the above-described embodiments, an explanation is given for the case where the substrate 50 is n-type, but the substrate 50 may be p-type or may have semi-insulating properties. For example, when manufacturing a semiconductor device as a high electron mobility transistor (HEMT) using the substrate 50, the substrate 50 preferably has semi-insulating properties.

In the above-described embodiments, the growth temperature and the V/III ratio are described as the first growth condition in the first step S200, but a growth condition other than the growth temperature and the V/III ratio may be adjusted, or the growth temperature, the V/III ratio, and another growth condition may be adjusted in combination, as the first growth condition so long as the first growth condition satisfies the formula (1). In these cases, the other growth condition serving as the first growth condition may be set to be substantially equal to the second growth condition or different from the second growth condition, depending on the objective.

In the above-described embodiments, the growth temperature and the V/III ratio are described as the second growth condition in the second step S300, but a growth condition other than the growth temperature and the V/III ratio may be adjusted, or the growth temperature, the V/III ratio, and another growth condition may be adjusted in combination, as the second growth condition so long as the second growth condition satisfies the formula (2).

In the above-described embodiments, an explanation is given for the case where the first growth condition is maintained in the inclined interface maintenance step S240 similarly to the inclined interface expansion step S220, but the growth condition in the inclined interface maintenance step S240 may be different from the growth condition in the inclined interface expansion step S220 so long as the growth condition in the inclined interface maintenance step S240 satisfies the formula (1). In this case, the growth condition in the inclined interface maintenance step S240 may be set so as to satisfy the formula (1) without only depending on the growth inhibition layer 20.

In the above-described embodiments, an explanation is given for the case where the second growth condition is maintained in the main growth step S340 similarly to the c-plane expansion step S320, but the growth condition in the main growth step S340 may be different from the growth condition in the c-plane expansion step S320 so long as the growth condition in the main growth step S340 satisfies the formula (2).

In the above-described embodiments, an explanation is given for the case where the second crystal layer 6 or the main growth layer 44 is sliced using a wire saw in the slicing step S170 and the slicing step S400, but for example, an outer peripheral blade slicer, an inner peripheral blade slicer, an electric discharge machine, or the like may be used.

In the above-described embodiments, an explanation is given for the case where the substrate 50 is obtained by slicing the main growth layer 44 in the laminated structure 90, but the present disclosure is not limited thereto. For example, the laminated structure 90 may be used as is to manufacture a semiconductor laminate for manufacturing a semiconductor device. Specifically, after preparing the laminated structure 90, in the semiconductor laminate manufacturing step, a semiconductor functional layer is epitaxially grown on the laminated structure 90 to prepare a semiconductor laminate. After preparing the semiconductor laminate, a back surface side of the laminated structure 90 is polished to remove the base substrate 10, the growth inhibition layer 20, the first layer 30, and the c-plane expanded layer 42 from the laminated structure 90. Thereby, a semiconductor laminate that includes the main growth layer 44 and the semiconductor functional layer can be obtained as in the above-described embodiments. According to this case, the slicing step S400 and the polishing step S500 for obtaining the substrate 50 can be omitted.

In the above-described embodiments, an explanation is given for the case where the manufacturing steps are complete after the substrate 50 is manufactured, but the substrate 50 may be used as the base substrate 10, and steps S190 to S500 may be repeated. Thereby, a substrate 50 having a further lowered dislocation density can be obtained. Further, a substrate 50 with further reduced variation in the off-angle θ of the c-axis 50ca can be obtained. Further, the steps S190 to S500 performed using the substrate 50 as the base substrate 10 may be set as one cycle, and the cycle may be repeated a plurality of times. Thereby, the dislocation density of the substrate 50 can be gradually lowered according to the number of times the cycle is repeated. Further, the variation in the off-angle θ of the c-axis 50ca of the substrate 50 can be gradually reduced according to the number of times the cycle is repeated. In a case where the first layer 30 is three-dimensionally grown by adjusting the first growth condition without depending on the growth inhibition layer 20 in the second and the following cycles, the growth inhibition layer forming step S190 may be omitted in the second and the following cycles.

EXAMPLES

Hereinafter, various experimental results supporting the effects of the present disclosure will be described. In the following, the "nitride semiconductor substrate" may be simply abbreviated as the "substrate".

(1) Experiment 1

(1-1) Preparation of Nitride Semiconductor Substrate

Substrates of samples 1 to 3 were prepared as follows. As for samples 1 and 2, laminated structures from which the substrates were sliced were also prepared.

[Conditions for Preparing the Nitride Semiconductor Substrate of Sample 1]
(Base Substrate)
  Material: GaN
  Manufacturing method: VAS method
  Diameter: 2 inches
  Thickness: 400 μm
  Low index crystal plane closest to the main surface: c-plane
(Growth Inhibition Layer)
  Material: SiN
  Apparatus: HVPE apparatus
  Formation conditions:
    Amount of supplied $SiH_2Cl_2$ gas: $8.9 \times 10^{-9}$ mol/min
    Partial pressure of $NH_3$ gas: 4.62 kPa
    Temperature: 1,050° C. (same for the first layer)
    Supply period: 30 sec
(First Layer)
  Material: GaN
  Growth method: HVPE method
  First growth condition:
    Partial pressure of GaCl gas: 9.5 kPa
    Partial pressure of $NH_3$ gas: 15 kPa
    Partial pressure of $H_2$ gas: 55 kPa
    Growth temperature: 1,050° C.
(Second Layer)
Material: GaN
  Growth method: HVPE method
  Second growth condition: the same as the first growth condition
  Thickness from the main surface of the base substrate to the surface of the second layer: about 2 mm (slicing condition)
  Thickness of the substrate: 400 μm
  Kerf loss: 200 μm As for sample 1, a plurality of laminated structures and a plurality of substrates were prepared.

[Conditions for Preparing the Nitride Semiconductor Substrate of Sample 2]
(Base Substrate)
  The same as sample 1.
(Growth Inhibition Layer)
  Material: the same as sample 1
  Growth method: HVPE method
  Formation conditions:
    Amount of supplied $SiH_2Cl_2$ gas: $2.2 \times 10^{-10}$ mol/min
    The partial pressure of $NH_3$ gas, the temperature, and the supply period were the same as sample 1.
(First Layer)
  The same as sample 1.
(Second Layer)
  The same as sample 1.
(Slicing Condition)
  The same as sample 1.

[Conditions for Preparing the Nitride Semiconductor Substrate of Sample 3]
(Base Substrate)
  The same as sample 1.
(Growth Inhibition Layer)
  Material: the same as sample 1
  Growth method: HVPE method
  Formation conditions:
    Amount of supplied $SiH_2Cl_2$ gas: $1.5 \times 10^{-8}$ mol/min
    The partial pressure of $NH_3$ gas, the temperature, and the supply period were the same as sample 1.
(First Layer)
  The same as sample 1.
(Second Layer)
  The same as sample 1.
(Slicing)
  Slicing was not performed because the second layer was not formed as a continuous film as described later.

[Conditions for Preparing the Nitride Semiconductor Substrate of Sample 4]
(Base Substrate)
  The same as sample 1.
(Crystal Layer)
  Material: GaN
  Growth method: HVPE method
  Growth condition: the same as the first layer and the second layer of sample
    Partial pressure of GaCl gas: 9.5 kPa
    Partial pressure of $NH_3$ gas: 15 kPa
    Partial pressure of $H_2$ gas: 55 kPa
    Growth temperature: 1,050° C.
    Thickness from the main surface of the base substrate to the surface of the crystal layer: about 2 mm (Slicing Condition)
The same as sample 1.
(1-2) Evaluation
Observation Using Fluorescence Microscope In each of samples 1 and 2, a cross section of the laminated structure was observed using a fluorescence microscope before the substrate was sliced.

Observation Using Multiphoton Excitation Microscope

Main surfaces of the base substrate and the substrates of samples 1, 2, and 4 were observed using a multiphoton excitation microscope. At this time, the dislocation density was measured by measuring a dark spot density over the entire main surface for every 250 μm field of view. It was confirmed that all dark spots on these substrates were dislocations by performing the measurement while shifting a focus in the thickness direction. Further, at this time, the ratio of the number of regions (low dislocation density regions) having a dislocation density lower than $1 \times 10^6$ cm$^{-2}$ to the total number of measurement regions of 250 μm field of view was determined. As shown in the results described below, the "low dislocation density regions" referred to herein means regions having a dislocation density lower than an average dislocation density in the main surface of the crystal layer of sample 4 in which the crystal layer was grown without the first step being performed.

X-Ray Rocking Curve Measurement

The following two types of X-ray rocking curve measurement were performed for each of the base substrate and the substrates of samples 1, 2, and 4.

For the X-ray rocking curve measurement, "X'Pert-PRO MRD" manufactured by Spectris was used, and "Hybrid monochromator" manufactured by the same company was used as the monochromator at the incident side. The hybrid monochromator includes an X-ray mirror and two crystals of the Ge (220) plane in this order from an X-ray light source side. In the measurement, first, X-rays emitted from the X-ray light source were made into parallel lights by the X-ray mirror. Thereby, the number of X-ray photons (i.e., X-ray intensity) to be used could be increased. Next, the parallel lights from the X-ray mirror were made into Cu Kα1 monochromatic lights by the two crystals of the Ge (220) plane. Next, the monochromatic lights from the two crystals of the Ge (220) plane were narrowed to a predetermined width through a slit and were then incident on the substrate. When a full width at half maximum is determined through simulation for a case where the rocking curve of the (0002) plane of a perfect crystal GaN is measured using the hybrid monochromator, the full width at half maximum is 25.7 arcsec. That is, this full width at half maximum is the theoretical measurement limit when measurement is performed using the above-described optical system.

In the measurement, X-rays that were incident on the substrate were parallel lights toward the substrate side in a cross section taken along the ω direction, but were not parallel lights in a cross section taken along a direction (direction of the rotation axis of the substrate) orthogonal to the ω direction. Therefore, the width of the X-rays in the ω direction was almost constant, but the width of the X-rays in the direction orthogonal to the ω direction increased while the X-rays traveled from the slit to the substrate. Accordingly, in the X-ray rocking curve measurement, the full width at half maximum of the X-rays diffracted at a predetermined crystal plane depends on the width of the incident side slit in the ω direction in which the X-rays were parallel lights.

On the other hand, the light receiving side was open. A window width of a detector on the light receiving side was 14.025 mm. In the above-described optical system, the goniometer radius was 420 mm, and therefore, fluctuation of the Bragg angle of ±0.95° could be measured.

X-Ray Rocking Curve Measurement 1

The X-ray rocking curve of the (0002) plane of each of the base substrate and the substrates of samples 1, 2, and 4 was measured by setting the width of the incident side slit in the ω direction to 0.1 mm. At this time, the measurement was performed at a plurality of measurement points that were set at 5 mm intervals in each of the m-axis direction and the a-axis direction orthogonal to the m-axis direction, in the main surface of each substrate. As a result of the measurement, the radius of curvature of the c-plane and the off-angle, which was the angle formed by the c-axis with respect to the normal of the main surface, were obtained based on the diffraction peak angle of the (0002) plane at each measurement point. Further, variation in the off-angle was calculated as a difference between the largest off-angle and the smallest off-angle within a diameter of 29.6 mm from the center of the main surface. Further, the full width at half maximum FWHMb of the (0002) plane diffraction when the width of the incident side slit in the ω direction was 0.1 mm was obtained at each measurement point.

X-Ray Rocking Curve Measurement 2

The X-ray rocking curve was measured for each of the base substrate and the substrate of sample 1 by setting the width of the incident side slit in the ω direction to 1 mm. The measurement was performed at the center of the main surface of each substrate. As a result of the measurement, the full width at half maximum FWHMa of the (0002) plane diffraction when the width of the incident side slit in the ω direction was 1 mm was obtained. Further, the ratio of FWHMa-FWHMb to FWHMa was obtained at the center of the main surface of each substrate.

In the X-ray rocking curve measurements 1 and 2, when the X-rays are incident on the main surface of each substrate at a Bragg angle of 17.28° of the (0002) plane with respect to the main surface, the X-ray footprint is about 0.337 mm when the width of the slit in the ω direction is 0.1 mm, and the X-ray foot print is about 3.37 mm when the width of the slit in the ω direction is 1 mm.

(1-3) Result

The results are shown in Table 1.

TABLE 1

|  | Sample 1 | Sample 2 | Sample 3 | Sample 4 | A |
|---|---|---|---|---|---|
| B | $8.9 \times 10^{-9}$ | $2.2 \times 10^{-10}$ | $1.6 \times 10^{-8}$ | — | — |
| First Step | Yes | Yes | Yes | None | — |
| Average dislocation density (cm$^{-2}$) | $6.5 \times 10^5$ | $1.2 \times 10^6$ | — | $1.5 \times 10^6$ | $3.0 \times 10$ |
| C | 85 | 37 | — | 30 | 0 |
| Radius (m) of curvature of c-plane | 23.3~67.1 | 12.6 | — | 11.3 | 7.64 |
| D | 0.025~0.073 | 0.13 | — | 0.15 | 0.22 |

TABLE 1-continued

|  | Sample 1 | Sample 2 | Sample 3 | Sample 4 | A |
|---|---|---|---|---|---|
| FWHMb (arcsec) (within main surface) | 29.1~38.5 | 37.2~62.9 | — | 38.5~66.2 | 40.1~77.8 |
| (FWHMa-FWHMb)/FWHMa (%) | 0.0~29.6 | — | — | — | 54.2~79.6 |

A = Base substrate
B = Amount (mol/min) of $SiH_2Cl_2$ gas supplied in growth inhibition layer forming step
C = Ration (%) of low dislocation density regions
D = Variation (°) in off-angle (within diameter of 29.6 mm)

Sample 4

As shown in Table 1, in the substrate of sample 4 obtained by the c-plane limited growth, the average dislocation density in the main surface was lower than that of the base substrate due to the effect of thickening the crystal layer. However, when the dislocation density of the substrate of sample 3 is represented by N', the above-described dislocation density reduction rate $N'/N_0$ was 0.5.

Further, in the substrate of sample 4, due to the effect of thickening the crystal layer, the radius of curvature of the c-plane was slightly larger than that of the base substrate, and variation in the off-angle of the c-axis was slightly smaller than that of the base substrate.

Sample 3

In sample 3 in which the amount of $SiH_2Cl_2$ gas supplied in the growth inhibition layer forming step was greater than $1.4 \times 10^{-8}$ mol/min, the surface of the second layer was not mirror-finished.

In sample 3, due to the large amount of $SiH_2Cl_2$ gas supplied in the growth inhibition layer forming step, the coverage rate of the growth inhibition portions with respect to the main surface of the base substrate was excessively high. Therefore, growth of the first layer was inhibited in the first step over the entire main surface of the base substrate. It is considered that as a result, the second layer was not formed as a continuous film and the surface of the second layer was not mirror-finished.

Therefore, evaluations were not performed for sample 3.

Sample 2

In sample 3 in which the amount of $SiH_2Cl_2$ gas supplied in the growth inhibition layer forming step was less than $4.4 \times 10^{-10}$ mol/min, a laminated structure described below was obtained.

Figure 11A:
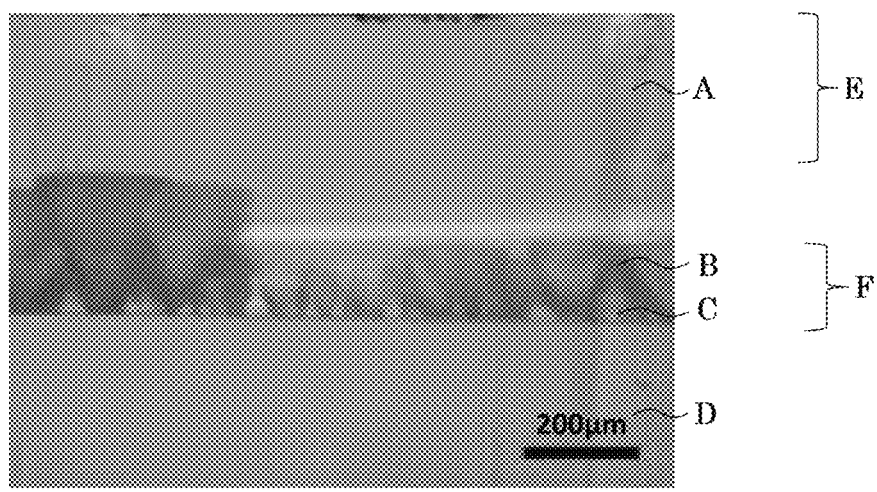
FIG. 11(a) is a diagram showing an observation image obtained by observing a cross-section of a laminated structure of sample 1 using a fluorescence microscope.
Figure 11B:
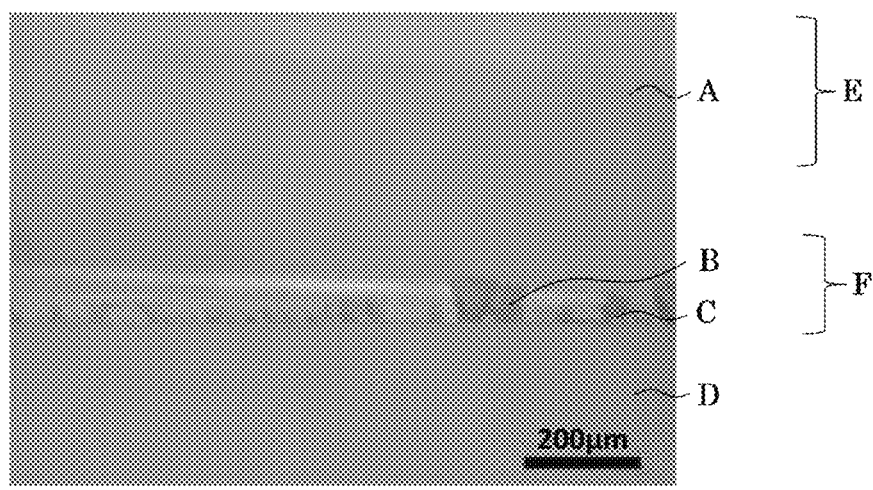
FIG. 11(b) is a diagram showing an observation image obtained by observing a cross-section of a laminated structure of sample 2 using the fluorescence microscope.

FIG. 11(b) is a diagram showing an observation image obtained by observing a cross section of the laminated structure of sample 2 using a fluorescence microscope. As shown in FIG. 11(b), in the laminated structure of sample 2, the first layer included the first c-plane growth region grown with the c-plane as a growth surface and the inclined interface growth region grown with inclined interfaces as growth surfaces, based on a difference in growth surfaces during the growth process (i.e., difference in oxygen concentration). The second c-plane growth region was formed as the second layer on the first layer.

In sample 2, the average distance between closest peaks in the first layer was about less than 50 μm. Further, the inclined interface growth region was discontinuously formed, and the first c-plane growth region and the second c-plane growth region were joined at many places.

As shown in Table 1, the average dislocation density in the main surface of the substrate of sample 2 was lower than those of the base substrate and sample 4, and was less than $1.2 \times 10^6$ cm$^{-2}$.

Further, in the substrate of sample 2, regions (low dislocation density regions) having a dislocation density lower than $1 \times 10^6$ cm$^{-2}$ constituted 37% of the main surface 50s. However, the dislocation density was $1 \times 10^6$ cm$^{-2}$ or higher in the remaining regions that constituted 63% of the main surface 50s.

Further, as shown in Table 1, in the substrate of sample 2, the radius of curvature of the c-plane and variation in the off-angle of the c-axis within the diameter of 29.6 mm were substantially equivalent to those of the substrate of sample 4.

In sample 2 described above, the amount of $SiH_2Cl_2$ gas supplied in the growth inhibition layer forming step was small, and therefore, the coverage rate of the growth inhibition portions with respect to the main surface of the base substrate was excessively low. Therefore, three-dimensional growth of the first layer could not be sufficiently promoted, and the first growth condition did not satisfy the formula (1). It is considered that as a result, the average distance between closest peaks in the first layer was short. Also, it is considered that the c-plane remained in the first step because three-dimensional growth of the first layer could not be sufficiently promoted.

In sample 2, the average distance between closest peaks in the first layer was short, and therefore, dislocations could not be sufficiently collected. Further, since the c-plane remained in the first step, dislocations were not reduced above portions in which the c-plane remained. It is considered that as a result of these, high dislocation density regions constituted 63% of the main surface of the substrate of sample 2.

Further, it is considered that since three-dimensional growth of the first layer could not be sufficiently promoted in sample 2, the radius of curvature of the c-plane of the substrate could not be sufficiently large.

Sample 1

In sample 1 in which the amount of $SiH_2Cl_2$ gas supplied in the growth inhibition layer forming step was within the range of $4.4 \times 10^{-10}$ mol/min or more and $1.4 \times 10^{-8}$ mol/min or less, a laminated structure described below was obtained.

Figure 12:
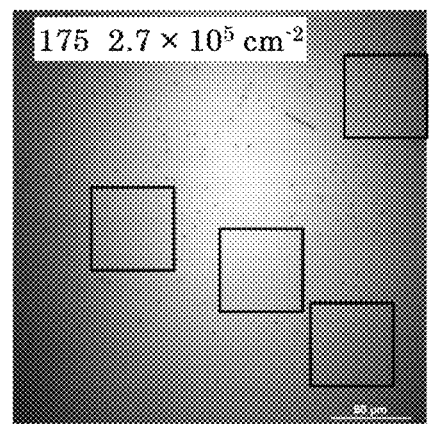
FIG. 12 shows a main surface of a nitride semiconductor substrate of sample 1 observed using a multiphoton excitation microscope.

FIG. 11(a) is a diagram showing an observation image obtained by observing a cross section of the laminated structure of sample 1 using a fluorescence microscope. FIG. 12 shows the main surface of the substrate of sample 1 observed using a multiphoton excitation microscope.

As shown in FIG. 11(a), in the laminated structure of sample 1 as well, the first layer included the first c-plane growth region and the inclined interface growth region. The second c-plane growth region was formed as the second layer on the first layer.

The average distance between closest peaks in the first layer of sample 1 was longer than that in sample 2, and was about 74 μm.

Further, the inclined interface growth region in sample 1 was continuously formed along the main surface of the base substrate. Further, the thickness from the main surface of the base substrate to a boundary surface at a position at which inclined interfaces of the second layer disappeared was about 250 μm.

As shown in Table 1, in the substrate of sample 1, the average dislocation density in the main surface was significantly lower than those in the base substrate and the substrates of samples 2 and 4, and was less than $6.5 \times 10^5$ cm$^{-2}$.

Further, when the dislocation density of the substrate of sample 1 is represented by N, the above-described dislocation density reduction rate $N/N_0$ was 0.216.

Further, the substrate of sample 1 did not include a region having a dislocation density higher than $3 \times 10^6$ cm$^{-2}$. Further, in the substrate of sample 1, regions (low dislocation density regions) having a dislocation density lower than $1 \times 10^6$ cm$^{-2}$ constituted 80% or more of the main surface.

Further, as indicated by rectangular frames in FIG. 12, the main surface of the substrate of sample 1 included dislocation-free regions of at least 50 μm square. Further, in the substrate of sample 1, 50 μm square dislocation-free regions were scattered over the entire main surface. The main surface of the substrate of sample 1 included 50 μm square dislocation-free regions that did not overlap each other at a density of about 2400 regions/cm$^2$.

Further, as shown in Table 1, the radius of curvature of the c-plane of the substrate of sample 1 was larger than those of the base substrate and the substrate of sample 4, and was 22 m or more. Further, in the substrate of sample 1, variation in the off-angle of the c-axis within the diameter of 29.6 mm was smaller than those in the base substrate and the substrate of sample 4, and was no greater than 0.075°.

Further, as shown in Table 1, in the substrate of sample 1, the full width at half maximum FWHMb of (0002) plane diffraction when the width of the slit in the ω direction was 0.1 mm was 38.5 arcsec or less at all (i.e., 100%) of the measurement points.

Further, as shown in Table 1, in the substrate of sample 1, FWHMa-FWHMb was 30% or less of FWHMa. For reference, in the base substrate, FWHMa-FWHMb was 50% or more of FWHMa.

In sample 1 described above, in the first step, the first growth condition could satisfy the formula (1) due to the growth inhibition layer. Thereby, the c-plane reliably disappeared during the growth process of the first layer. Since the c-plane reliably disappeared, dislocations could be reliably bent at positions where inclined interfaces in the first layer were exposed. It was confirmed that as a result, the dislocation density in the main surface of the substrate could be efficiently lowered.

Further, in sample 1, since the first growth condition satisfied the formula (1) due to the growth inhibition layer, the average distance between closest peaks was greater than 50 μm. It was confirmed that as a result, the dislocation density in the main surface of the nitride semiconductor substrate could be sufficiently lowered. Also, it was confirmed that since the average distance between closest peaks was greater than 50 μm, dislocation-free regions of at least 25 μm square could be formed.

Further, it was confirmed that in sample 1, the radius of curvature of the c-plane of the substrate could be made larger than the radius of curvature of the c-plane of the base substrate, and variation in the off-angle of the c-axis of the substrate could be made smaller than variation in the off-angle of the c-axis of the base substrate.

Further, in sample 1, there were few dislocations and all crystal quality factors of the substrate were good in a well-balanced manner over a wide range of the main surface of the substrate as described above. It was confirmed that as a result, FWHMb was 38.5 arcsec or less over a wide range of the main surface of the substrate of sample 1.

Further, in sample 1, all crystal quality factors were good in a well-balanced manner and the radius of curvature of the c-plane of the substrate was large as described above. It was confirmed that as a result of these, in sample 1, when the X-ray rocking curve measurement was performed by varying the width of the incident side slit, the difference FWHMa-FWHMb in full width at half maximum was 30% or less of FWHMa.

(2) Experiment 2

(2-1) Preparation of Nitride Semiconductor Substrate

In order to compare the in-plane distribution in the X-ray rocking curve measurement with sample 1 of Experiment 1 described above, the following samples 5 and 6 were prepared. The substrate of sample 5 is a substrate obtained from a crystal layer grown to be thick with the c-plane as a growth surface. Further, the substrate of sample 6 is a substrate prepared by a conventional VAS method and corresponds to the base substrate.

[Conditions for Preparing the Nitride Semiconductor Substrate of Sample 5]

(Base Substrate)
  Material: GaN
  Manufacturing method: VAS method
  Diameter: 62 mm
  Thickness: 400 μm
  Low index crystal plane closest to the main surface: c-plane
  Off-angle: 0.5° in the m-axis direction
  $N_0$ pattern processing such as formation of a mask layer was performed on the main surface.

(Crystal Layer)
  Material: GaN
  Growth method: HVPE method
  Growth temperature: 1,050° C.
  V/III ratio: 2.8
  Growth period: 15 hours (Processing)
  Grinding: A cylindrical region was removed to obtain a columnar region with a diameter of 56 mm.
  Slice: 630 μm thick, 5 sheets
  Beveling processing: The diameter was 50.8 mm.
  Polishing processing: 400 to 450 μm thick.

[Conditions for Preparing the Nitride Semiconductor Substrate of Sample 6]

The substrate of sample 6 was prepared using the conventional VAS method similar to that used for the base substrate. In sample 6, the radius of curvature of the c-plane, the dislocation density, and the like were the same as those of the base substrate, except that an absolute value of the off-angle and an off-direction were different from those of the base substrate.

(2-2) Evaluation

X-Ray Rocking Curve Measurement

The two types of X-ray rocking curve measurement that were the same as those performed in Experiment 1 were performed for each of the substrates of samples 1, 5, and 6. At this time, the measurement was performed at a plurality of measurement points set at 5 mm intervals in each of the m-axis direction and the a-axis direction orthogonal to the m-axis direction, in the main surface of each substrate. Thereby, the ratio of FWHMa-FWHMb to FWHMa was obtained at the plurality of measurement points of each sample.

(2-3) Result

The results of samples 1, 5, and 6 are shown in Tables 2, 3, and 4, respectively. In the tables below, "difference" means (FWHMa-FWHMb)/FWHMa (%).

TABLE 2

<Sample 1>

| | slit = 0.1 | | | slit = open | | |
|---|---|---|---|---|---|---|
| (mm) | ω (deg.) | FWHMb (sec.) | (mm) | ω (deg.) | FWHMa (sec.) | difference |
| | | | //M | | | |
| −20 | 17.29104 | 30.8 | −20 | 17.29125 | 32.5 | 5.2% |
| −15 | 17.2961 | 30.5 | −15 | 17.29599 | 32.8 | 7.0% |
| −10 | 17.29962 | 30.8 | −10 | 17.29949 | 31.6 | 2.5% |
| −5 | 17.30262 | 33.2 | −5 | 17.30247 | 34 | 2.4% |
| 0 | 17.30538 | 33.5 | 0 | 17.30487 | 34.1 | 1.8% |
| 5 | 17.30846 | 35.4 | 5 | 17.30832 | 35.4 | 0.0% |
| 10 | 17.31416 | 32.9 | 10 | 17.31426 | 34.6 | 4.9% |
| 15 | 17.32049 | 30.3 | 15 | 17.32053 | 33.4 | 9.3% |
| 20 | 17.32978 | 33.6 | 20 | 17.32954 | 46.4 | 27.6% |
| | | | //a | | | |
| −20 | 17.5683 | 30.3 | −20 | 17.56824 | 40.6 | 25.4% |
| −15 | 17.57721 | 29.1 | −15 | 17.5772 | 33 | 11.8% |
| −10 | 17.58455 | 30 | −10 | 17.58476 | 37 | 18.9% |
| −5 | 17.59427 | 30.7 | −5 | 17.59416 | 35.7 | 14.0% |
| 0 | 17.60092 | 31.4 | 0 | 17.60102 | 35.3 | 11.0% |
| 5 | 17.60744 | 31.1 | 5 | 17.60759 | 34.9 | 10.9% |
| 10 | 17.61468 | 34 | 10 | 17.61472 | 36.1 | 5.8% |
| 15 | 17.62017 | 33.2 | 15 | 17.62031 | 34.7 | 4.3% |
| 20 | 17.62637 | 30.9 | 20 | 17.62658 | 33.8 | 8.6% |

TABLE 3

<Sample 5>

| | slit = 0.1 | | | slit = open | | |
|---|---|---|---|---|---|---|
| (mm) | ω (deg.) | FWHMb (sec.) | (mm) | ω (deg.) | FWHMa (sec.) | difference |
| | | | //M | | | |
| −20 | 17.58718 | 30.6 | −20 | 17.58637 | 61 | 49.8% |
| −15 | 17.60427 | 29.9 | −15 | 17.60367 | 49 | 39.0% |
| −10 | 17.62154 | 29.4 | −10 | 17.62094 | 53.2 | 44.7% |
| −5 | 17.63899 | 29.2 | −5 | 17.63827 | 51.6 | 43.4% |
| 0 | 17.65626 | 28.1 | 0 | 17.65561 | 52.3 | 46.3% |
| 5 | 17.67447 | 29.4 | 5 | 17.6738 | 55.2 | 46.7% |
| 10 | 17.6939 | 29.6 | 10 | 17.6931 | 56.5 | 47.6% |
| 15 | 17.71332 | 28.2 | 15 | 17.71235 | 59.2 | 52.4% |
| 20 | 17.73509 | 28.9 | 20 | 17.73384 | 68.2 | 57.6% |
| | | | //a | | | |
| −20 | 17.19294 | 36.3 | −20 | 17.19209 | 75.8 | 52.1% |
| −15 | 17.21843 | 33.1 | −15 | 17.21749 | 75.9 | 56.4% |
| −10 | 17.24258 | 31.4 | −10 | 17.24179 | 68.4 | 54.1% |
| −5 | 17.26492 | 29.8 | −5 | 17.26405 | 67.1 | 55.6% |
| 0 | 17.28636 | 31.4 | 0 | 17.28551 | 67.3 | 53.3% |
| 5 | 17.30887 | 31.4 | 5 | 17.30794 | 69.2 | 54.6% |
| 10 | 17.3332 | 33.6 | 10 | 17.33179 | 78.2 | 57.0% |
| 15 | 17.35942 | 32.9 | 15 | 17.35821 | 79.7 | 58.7% |
| 20 | 17.385 | 30.5 | 20 | 17.38469 | 75.4 | 59.5% |

TABLE 4

<Sample 6: corresponds to base substrate>

| | slit = 0.1 | | | slit = open | | |
|---|---|---|---|---|---|---|
| (mm) | ω (deg.) | FWHMb (sec.) | (mm) | ω (deg.) | FWHMa (sec.) | difference |
| | | | //M | | | |
| −20 | 17.07689 | 42.9 | −20 | 17.07888 | 187.2 | 77.1% |
| −15 | 17.13755 | 45.6 | −15 | 17.14011 | 184 | 75.2% |
| −10 | 17.19635 | 46.6 | −10 | 17.19869 | 171.7 | 72.9% |
| −5 | 17.25394 | 46.3 | −5 | 17.25502 | 170.3 | 72.8% |
| 0 | 17.31046 | 46.1 | 0 | 17.31278 | 170.3 | 72.9% |
| 5 | 17.36629 | 44.2 | 5 | 17.36438 | 169.1 | 73.9% |
| 10 | 17.42552 | 44.1 | 10 | 17.42475 | 175.2 | 74.8% |
| 15 | 17.48624 | 45.6 | 15 | 17.48797 | 179.6 | 74.6% |
| 20 | 17.5534 | 43.9 | 20 | 17.5618 | 208.5 | 78.9% |
| | | | //a | | | |
| −20 | 17.14414 | 47.3 | −20 | 17.14824 | 211.2 | 77.6% |
| −15 | 17.20841 | 46.2 | −15 | 17.20506 | 183.2 | 74.8% |
| −10 | 17.27142 | 47.2 | −10 | 17.27079 | 180.1 | 73.8% |
| −5 | 17.33018 | 50.5 | −5 | 17.3292 | 176.7 | 71.4% |
| 0 | 17.38817 | 47.4 | 0 | 17.38517 | 169 | 72.0% |
| 5 | 17.44551 | 50.2 | 5 | 17.44218 | 166.6 | 69.9% |
| 10 | 17.50449 | 46.5 | 10 | 17.50376 | 172.9 | 73.1% |
| 15 | 17.56355 | 43.9 | 15 | 17.5611 | 173 | 74.6% |
| 20 | 17.62587 | 46.3 | 20 | 17.62643 | 178.5 | 74.1% |

[Sample 6]

As shown in Table 4, in the substrate of sample 6 prepared by the conventional VAS method, variation in the off-angle of the c-axis within a diameter of 40 mm was about ±0.24°. Further, in the substrate of sample 6, FWHMb was greater than 38.5 arcsec at all the measurement points. Further, in the substrate of sample 6, (FWHMa-FWHMb)/FWHMa was greater than 30% at all the measurement points.

[Sample 5]

As shown in Table 3, in the substrate of sample 5 obtained from the crystal layer grown to be thick with the c-plane as a growth surface, variation in the off-angle of the c-axis within the diameter of 40 mm was improved as compared with the substrate of sample 5, and was about ±0.074°. Further, FWHMb of the substrate of sample 5 was improved as compared with FWHMb of the substrate of sample 5.

However, in the substrate of sample 5, (FWHMa-FWHMb)/FWHMa greatly exceeded 30% at all the measurement points.

As described above, the substrate of sample 5, which had high quality as a conventional substrate, had improved dislocation density and improved off-angle variation as compared with the base substrate, but did not have any point satisfying the following conditions regarding the full width at half maximum: FWHMb≤38.5 arcsec and (FWHMa−FWHMb)/FWHMa≤30%. The reason is considered as follows: in the substrate of sample 5, at least any of the above-described crystal quality factors was not as good as that of the substrate of sample 1.

Even the substrate of sample 5, which had a relatively high quality as a conventional substrate, did not satisfy the above-described conditions regarding the full width at half maximum, and accordingly, it is considered that substrates prepared by other conventional manufacturing methods do not satisfy the above-described conditions regarding the full width at half maximum.

[Sample 1]

In contrast, as shown in Table 2, in the substrate of sample 1, variation in the off-angle of the c-axis within the diameter of 40 mm was smaller than those of the substrates of samples 4 and 5, and was about +0.030°.

Further, in the substrate of sample 1, FWHMb was not greater than 38.5 arcsec at all the measurement points. Further, in the substrate of sample 1, (FWHMa-FWHMb)/FWHMa was no greater than 30% at all the measurement points. In the substrate of sample 1, FWHMa≥FWHMb was satisfied at all the measurement points.

As described above, in the substrate of sample 1 obtained by the above-described manufacturing method, not only the dislocation density could be lowered and the variation in the off-angle could be reduced, but also all of the above-described crystal quality factors that determine the full width at half maximum were good in a well-balanced manner. It was confirmed that as a result, in the substrate of sample 1, FWHMb was no greater than 38.5 arcsec. Further, it was confirmed that in sample 1, (FWHMa-FWHMb)/FWHMa was no greater than 30% because the radius of curvature of the c-plane was large and the above-described crystal quality factors were good in a well-balanced manner over the entire region irradiated with X-rays even when the width of the slit was 1 mm.

<Preferable Aspects of the Present Disclosure>

Hereinafter, preferable aspects of the present disclosure will be supplementarily described.

Supplementary Note 1

A method for manufacturing a nitride semiconductor substrate, including:
- a step of preparing a base substrate that is constituted by a single crystal of a group III nitride semiconductor, has a mirror main surface, and in which a low index crystal plane closest to the main surface is a (0001) plane;
- a growth inhibition layer forming step of performing in situ formation of a growth inhibition layer in a vapor phase growth apparatus, the growth inhibition layer including growth inhibition portions that are randomly scattered over the entire main surface of the base substrate;
- a first step of growing a first layer by epitaxially growing a single crystal of a group III nitride semiconductor on the main surface of the base substrate via openings in the growth inhibition layer by using the vapor phase growth apparatus in a state where the base substrate on which the growth inhibition layer has been formed is placed in the vapor phase growth apparatus, the single crystal of the group III nitride semiconductor having a top surface at which a (0001) plane is exposed, a plurality of recessed portions formed by inclined interfaces other than the (0001) plane being generated in the top surface due to the growth inhibition layer, the inclined interfaces being gradually expanded toward an upper side of the main surface of the base substrate to make the (0001) plane disappear from the top surface, and a surface of the first layer being constituted only by the inclined interfaces; and
- a second step of growing a second layer that includes a mirror surface by epitaxially growing a single crystal of a group III nitride semiconductor on the first layer so as to make the inclined interfaces disappear.

Supplementary Note 2

The method for manufacturing a nitride semiconductor substrate according to Supplementary Note 1,
wherein, in the first step,
a plurality of valleys and a plurality of peaks are formed in the surface of the first layer as a result of the plurality of recessed portions being generated in the top surface of the single crystal due to the growth inhibition layer and the (0001) plane disappearing, and
when an arbitrary cross section that is perpendicular to the main surface is observed,
an average distance between a pair of peaks spaced apart from each other in a direction along the main surface is greater than 50 μm, the pair of peaks being closest to each other among the plurality of peaks with one of the plurality of valleys sandwiched therebetween.

Supplementary Note 3

The method for manufacturing a nitride semiconductor substrate according to Supplementary Note 2,
wherein, in the first step, the average distance between the pair of peaks closest to each other is less than 800 μm.

Supplementary Note 4

The method for manufacturing a nitride semiconductor substrate according to any one of Supplementary Notes 1 to 3,
wherein, in the first step, after the (0001) plane disappears from the surface, growth of the first layer is continued over a predetermined thickness while a state where the surface is constituted only by the inclined interfaces is maintained.

Supplementary Note 5

The method for manufacturing a nitride semiconductor substrate according to any one of Supplementary Notes 1 to 4, further including
a step of slicing at least one nitride semiconductor substrate from the second layer after the second step.

Supplementary Note 6

The method for manufacturing a nitride semiconductor substrate according to Supplementary Note 5,
wherein, in the step of preparing the base substrate, the base substrate of which the (0001) plane is curved in a concave spherical shape with respect to the main surface is prepared, and
in the step of slicing the nitride semiconductor substrate, variation in an off-angle that is formed by a <0001> axis with respect to a normal of a main surface of the nitride semiconductor substrate is made smaller than variation in an off-angle that is formed by the <0001> axis with respect to a normal of the main surface of the base substrate.

Supplementary Note 7

The method for manufacturing a nitride semiconductor substrate according to any one of Supplementary Notes 1 to 6,
wherein, in the first step,
a first c-plane growth region that grows with the (0001) plane as a growth surface is formed in the first layer,
a raised portion is formed at a position in the first c-plane growth region at which the (0001) plane disappears, and a pair of inclined portions are formed on opposite sides of the raised portion of the first c-plane growth region as loci of intersections between the (0001) plane and the inclined interfaces, and
an angle formed by the pair of inclined portions is 70° or less.

Supplementary Note 8

The method for manufacturing a nitride semiconductor substrate according to any one of Supplementary Notes 1 to 7,
wherein, in the first step, {11-2m} planes that satisfy m≥3 are generated as the inclined interfaces.

Supplementary Note 9

The method for manufacturing a nitride semiconductor substrate according to any one of Supplementary Notes 1 to 8, wherein, in the first step, the first layer is grown under a first growth condition that satisfies formula (1), and in the second step, the second layer is grown under a second growth condition that satisfies formula (2), $$G_{c1} > G_i / \cos\alpha \quad (1)$$

$$G_{c2} < G_i / \cos\alpha \quad (2)$$

wherein $G_{c1}$ represents a growth rate of the (0001) plane in the first layer, $G_{c2}$ represents a growth rate of the (0001) plane in the second layer, $G_i$ represents a growth rate of an inclined interface in each of the first layer and the second layer, the inclined interface being the most inclined with respect to the (0001) plane among the inclined interfaces, and a represents an angle formed by the (0001) plane and the inclined interface most inclined with respect to the (0001) plane in each of the first layer and the second layer.

Supplementary Note 10

The method for manufacturing a nitride semiconductor substrate according to Supplementary Note 9, wherein, in the first step, the first growth condition satisfies the formula (1) due to the growth inhibition layer.

Supplementary Note 11

The method for manufacturing a nitride semiconductor substrate according to any one of Supplementary Notes 1 to 10, wherein, in the growth inhibition layer forming step, a silicon nitride layer is formed as the growth inhibition layer.

Supplementary Note 12

The method for manufacturing a nitride semiconductor substrate according to any one of Supplementary Notes 1 to 11, wherein the first step is performed while the growth inhibition layer forming step is performed.

Supplementary Note 13

A nitride semiconductor substrate, having a diameter of 2 inches or more and including a main surface for which the closest low index crystal plane is a (0001) plane, FWHMb is 38.5 arcsec or less, difference FWHMa-FWHMb obtained by subtracting FWHMb from FWHMa is 30% or less of FWHMa, and FWHMa≥FWHMb, wherein FWHMa is full width at half maximum of the (0002) plane diffraction when a slit width in ω direction is 1 mm, and FWHMb is full width at half maximum of the (0002) plane diffraction when a slit width in ω direction is 0.1 mm.

Supplementary Note 14

The nitride semiconductor substrate according to Supplementary Note 13, wherein, when the X-ray rocking curve of (0002) plane diffraction is measured at a plurality of measurement points set at 5 mm intervals in the main surface, by setting the width of the slit in the ω direction to 0.1 mm, the full width at half maximum FWHMb of the (0002) plane diffraction is 38.5 arcsec or less at 90% or more of all the measurement points.

Supplementary Note 15

The nitride semiconductor substrate according to Supplementary Note 13 or 14, wherein, when a dislocation density is determined from a dark spot density by observing the main surface using a multiphoton excitation microscope in a field of view of 250 μm square, the main surface does not include a region that has a dislocation density higher than $3\times10^6$ cm$^{-2}$, and regions having a dislocation density lower than $1\times10^6$ cm$^{-2}$ constitute 70% or more of the main surface.

Supplementary Note 16

A nitride semiconductor substrate that has a diameter of 2 inches or more, wherein, when a dislocation density is determined from a dark spot density by observing a main surface of the nitride semiconductor substrate using a multiphoton excitation microscope in a field of view of 250 μm square, the main surface does not include a region that has a dislocation density higher than $3\times10^6$ cm 2, and regions having a dislocation density lower than $1\times10^6$ cm$^{-2}$ constitute 70% or more of the main surface.

Supplementary Note 17

The nitride semiconductor substrate according to any one of Supplementary Notes 13 to 16, wherein the main surface includes a dislocation-free region of at least 25 μm square.

Supplementary Note 18

The nitride semiconductor substrate according to any one of Supplementary Notes 13 to 17, wherein the main surface includes dislocation-free regions of 25 μm square that do not overlap each other at a density of 100 regions/cm$^2$ or more.

Supplementary Note 19

The nitride semiconductor substrate according to any one of Supplementary Notes 13 to 18, wherein an oxygen concentration is $5\times10^{16}$ cm$^{-3}$ or less.

Supplementary Note 20

A laminated structure including:

a base substrate that is constituted by a single crystal of a group III nitride semiconductor, has a mirror main surface, and in which a low index crystal plane closest to the main surface is a (0001) plane;

a growth inhibition layer that includes growth inhibition portions randomly scattered over the main surface of the base substrate;

a first low oxygen concentration region that is provided on the main surface of the base substrate and the growth inhibition portions and is constituted by a single crystal of a group III nitride semiconductor;

a high oxygen concentration region that is provided on the first low oxygen concentration region and is constituted by a single crystal of a group III nitride semiconductor; and a second low oxygen concentration region that is provided on the high oxygen concentration region and is constituted by a single crystal of a group III nitride semiconductor, wherein an oxygen concentration in the high oxygen concentration region is higher than an oxygen concentration in the first low oxygen concentration region and an oxygen concentration in the second low oxygen concentration region, and when an arbitrary cross section that is perpendicular to the main surface is observed, an upper surface of the first low oxygen concentration region includes a plurality of valleys and a plurality of mountains, and an average distance between a pair of mountains spaced apart from each other in a direction along the main surface is greater than 50 μm, the pair of mountains being closest to each other among the plurality of mountains with one of the plurality of valleys sandwiched therebetween.

Supplementary Note 21

The laminated structure according to Supplementary Note 20, wherein the high oxygen concentration region is provided continuously along the main surface of the base substrate.

Supplementary Note 22

The laminated structure according to Supplementary Note 20 or 21, wherein the first low oxygen concentration region includes pairs of inclined portions provided on opposite sides of the mountains, and an angle formed by each pair of inclined portions is 70° or less.

Supplementary Note 23

The laminated structure according to any one of Supplementary Notes 20 to 22, wherein when $N_0$ represents a dislocation density in the main surface of the base substrate and N represents a dislocation density in a boundary surface that extends along the main surface at an upper end of the high oxygen concentration region, a dislocation density reduction rate $N/N_0$ is smaller than a dislocation density reduction rate $N'/N_0$ where N' represents a dislocation density in a surface of a crystal layer of a group III nitride semiconductor of a case where the crystal layer is epitaxially grown on the main surface of the base substrate so as to have a thickness equal to a thickness from the main surface of the base substrate to the boundary surface, with only the (0001) plane as a growth surface.

Supplementary Note 24

The laminated structure according to any one of Supplementary Notes 20 to 23, wherein a thickness from the main surface of the base substrate to a boundary surface that extends along the main surface at an upper end of the high oxygen concentration region is 1.5 mm or less, and when $N_0$ represents a dislocation density in the main surface of the base substrate and N represents a dislocation density in the boundary surface, a dislocation density reduction rate $N/N_0$ is 0.3 or less.

REFERENCE SIGNS LIST

10 Base substrate
20 Growth inhibition layer
30 First layer
40 Second layer
50 Nitride semiconductor substrate (substrate)

The invention claimed is:

1. A nitride semiconductor substrate, having a diameter of 2 inches or more and including a main surface, wherein at a center of the main surface, an off-angle formed by a <0001> axis with respect to a normal of the center of the main surface is greater than 0° and 1° or less, and when an X-ray rocking curve of (0002) plane diffraction is measured by irradiating the main surface with Cu Kα1 X-rays via a two-crystal monochromator of a Ge (220) plane and a slit, FWHMb is 38.5 arcsec or less, difference FWHMa-FWHMb obtained by subtracting FWHMb from FWHMa is 30% or less of FWHMa, and FWHMa≥FWHMb, wherein FWHMa is full width at half maximum of the (0002) plane diffraction when a slit width in ω direction is 1 mm, FWHMb is full width at half maximum of the (0002) plane diffraction when a slit width in the ω direction is 0.1 mm, and the ω direction is a circumferential direction around a central axis that passes through a center of the nitride semiconductor substrate, is parallel to the main surface of the nitride semiconductor substrate, and is perpendicular to a direction in which the X-rays are incident on the center of the nitride semiconductor substrate, in the X-ray rocking curve measurement.

2. The nitride semiconductor substrate according to claim 1, wherein, when the X-ray rocking curve of (0002) plane diffraction is measured at a plurality of measurement points set at 5 mm intervals in the main surface, by setting the width of the slit in the ω direction to 0.1 mm, the full width at half maximum FWHMb of the (0002) plane diffraction is 38.5 arcsec or less at 90% or more of all the measurement points.

3. The nitride semiconductor substrate according to claim 1, wherein, when a dislocation density is determined from a dark spot density by observing the main surface using a multiphoton excitation microscope in a field of view of 250 μm square, the main surface does not include a region that has a dislocation density higher than $3\times10^6$ $cm^{-2}$, and regions having a dislocation density lower than $1\times10^6$ $cm^{-2}$ constitute 70% or more of the main surface.

4. The nitride semiconductor substrate according to claim 1, wherein the main surface includes dislocation-free regions of 25 μm square that do not overlap each other at a density of 100 regions/$cm^2$ or more.

5. The nitride semiconductor substrate according to claim 1, wherein the oxygen concentration is $5\times10^{16}$ $cm^{-3}$ or less.

* * * * *